US011965917B2

(12) United States Patent
Mitsugi et al.

(10) Patent No.: US 11,965,917 B2
(45) Date of Patent: Apr. 23, 2024

(54) POWER MEASUREMENT DEVICE

(71) Applicant: TOSHIBA MITSUBISHI-ELECTRIC INDUSTRIAL SYSTEMS CORPORATION, Tokyo (JP)

(72) Inventors: Yasuaki Mitsugi, Tokyo (JP); Takashi Shigemasa, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 118 days.

(21) Appl. No.: 17/791,221

(22) PCT Filed: Oct. 6, 2020

(86) PCT No.: PCT/JP2020/037814
§ 371 (c)(1),
(2) Date: Jul. 7, 2022

(87) PCT Pub. No.: WO2022/074724
PCT Pub. Date: Apr. 14, 2022

(65) Prior Publication Data
US 2023/0349959 A1    Nov. 2, 2023

(51) Int. Cl.
*G01R 21/133* (2006.01)
*G01R 19/25* (2006.01)

(52) U.S. Cl.
CPC ..... *G01R 21/1331* (2013.01); *G01R 19/2513* (2013.01)

(58) Field of Classification Search
CPC ............ G01R 21/1331; G01R 19/2513; G01R 21/003
(Continued)

(56) References Cited

U.S. PATENT DOCUMENTS

| 7,920,976 B2 | 4/2011 | Banhegyesi |
| 2010/0085037 A1* | 4/2010 | Ning .................... G01R 21/003 324/140 R |

(Continued)

FOREIGN PATENT DOCUMENTS

| JP | 5794864 B2 | 10/2015 |
| JP | 6199206 B2 | 9/2017 |

OTHER PUBLICATIONS

Indian First Examination Report dated Oct. 14, 2023 in corresponding Indian Patent Application No. 202217039956 (with English translation), 2 pages.

(Continued)

*Primary Examiner* — Giovanni Astacio-Oquendo
(74) *Attorney, Agent, or Firm* — XSENSUS LLP

(57) ABSTRACT

A power measurement device includes: a first three-phase to two-phase converter converting a three-phase voltage signal of three-phase AC power into a two-phase voltage signal; a second three-phase to two-phase converter converting a three-phase current signal of the three-phase AC power into a two-phase current signal; an instantaneous power calculator calculating an instantaneous value of active power of the three-phase AC power and an instantaneous value of reactive power of the three-phase AC power based on the two-phase voltage signal and the two-phase current signal; a first moving average calculator calculating multiple active power average values of different moving average data quantities; a second moving average calculator calculating multiple reactive power average values of different moving average data quantities; and calculators that calculate average active powers corresponding to a frequency of the three-phase AC power, and the reactive power corresponding to the frequency of the three-phase AC power.

8 Claims, 13 Drawing Sheets

(58) Field of Classification Search
USPC ............ 324/140, 76.11, 76.69, 76.68, 76.55
See application file for complete search history.

(56) References Cited

U.S. PATENT DOCUMENTS

2018/0003747 A1* 1/2018 Choi .................... G01R 21/003
2019/0245351 A1* 8/2019 Lee ....................... G01R 11/52

OTHER PUBLICATIONS

International Search Report and Written Opinion dated Dec. 28, 2020, received for PCT Application PCT/JP2020/037814, filed on Oct. 6, 2020, 11 pages including English Translation.

* cited by examiner

POWER MEASUREMENT DEVICE

CROSS-REFERENCE TO RELATED APPLICATION

The present application is based on PCT filing PCT/JP2020/037814, filed Oct. 6, 2020, the entire contents of which are incorporated herein by reference.

TECHNICAL FIELD

Embodiments of the invention relate to a power measurement device.

BACKGROUND ART

In the fast frequency response market, high-speed and highly-accurate measurement technology of the average apparent energy of a power system is desirable to realize high-speed control of power generation and storage plants and the like.

For example, in a known method for measuring apparent power, the instantaneous value of the active power and the instantaneous value of the reactive power are determined by acquiring the three-phase AC voltage and the three-phase alternating current of the power system by high-speed sampling and by performing a Clarke transformation of the three-phase AC voltage and the three-phase alternating current.

Also, harmonics, distorted waves, and the like are easily mixed into the instantaneous value of the active power and/or the instantaneous value of the reactive power when system disturbances such as an unbalanced state or the like occur in power electronics control in which a semiconductor element switches a large current. Therefore, it has also been proposed to calculate an average value synchronized with the power supply period based on the instantaneous value of the active power and the instantaneous value of the reactive power.

For example, a moving average filter is used to calculate the average value. However, in a moving average filter fixed at the nominal period, it is difficult to calculate an accurate average value under fluctuating power supply frequency conditions. It is therefore desirable for a power measurement device to be capable of more accurately measuring the average apparent power even when frequency fluctuation occurs in the presence of a system disturbance.

PRIOR ART DOCUMENTS

Patent Literature

PTL 1

Japanese Patent No. 6199206

SUMMARY OF INVENTION

Technical Problem

Embodiments of the invention provide a power measurement device that can more accurately measure the average apparent power even when frequency fluctuation occurs in the presence of a system disturbance.

Solution to Problem

According to an embodiment of the invention, a power measurement device includes: a first three-phase to two-phase converter converting a three-phase voltage signal of three-phase AC power into a two-phase voltage signal; a second three-phase to two-phase converter converting a three-phase current signal of the three-phase AC power into a two-phase current signal; an instantaneous power calculator calculating an instantaneous value of active power of the three-phase AC power and an instantaneous value of reactive power of the three-phase AC power based on the two-phase voltage signal and the two-phase current signal; a first moving average calculator including multiple first moving average filters calculating moving averages, wherein the multiple first moving average filters use different data quantities, and the first moving average calculator causes the multiple first moving average filters to respectively calculate multiple active power average values of different moving average data quantities; a second moving average calculator including multiple second moving average filters calculating moving averages, wherein the multiple second moving average filters use different data quantities, and the second moving average calculator causes the multiple second moving average filters to respectively calculate multiple reactive power average values of different moving average data quantities; a first average value calculator calculating an average value of the active power corresponding to a frequency of the three-phase AC power based on the multiple active power average values and frequency information representing the frequency of the three-phase AC power; and a second average value calculator calculating an average value of the reactive power corresponding to the frequency of the three-phase AC power based on the multiple reactive power average values and the frequency information representing the frequency of the three-phase AC power.

Advantageous Effects of Invention

According to embodiments of the invention, a power measurement device is provided that can more accurately measure the average apparent power even when frequency fluctuation occurs in the presence of a system disturbance.

MODES FOR CARRYING OUT THE INVENTION

Figure 1:
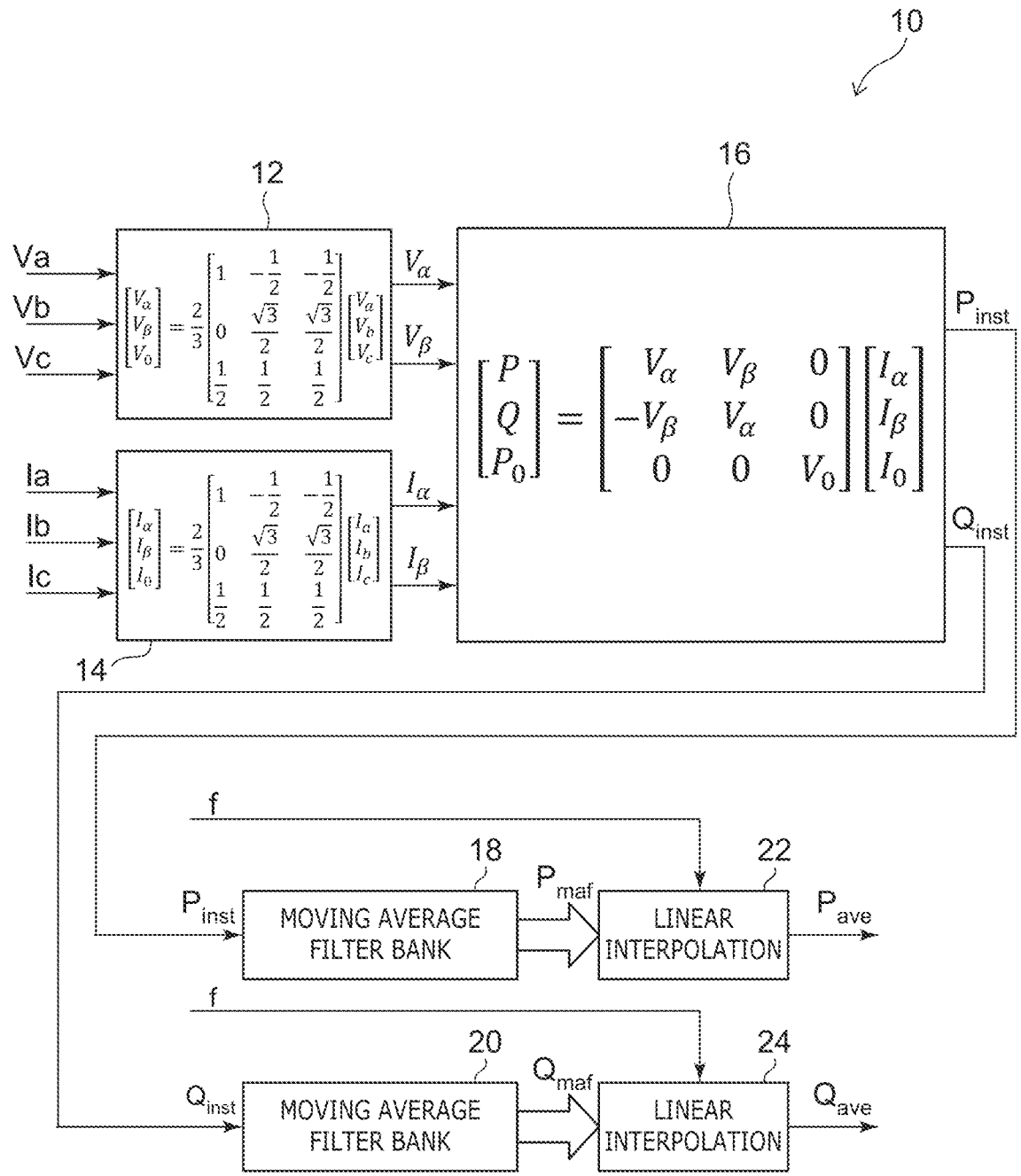
FIG. 1 is a block diagram schematically illustrating a power measurement device according to a first embodiment.

Embodiments will now be described with reference to the drawings.

The drawings are schematic and conceptual; and the relationships between the thicknesses and widths of portions, the proportions of sizes among portions, etc., are not necessarily the same as the actual values. The dimensions and/or the proportions may be illustrated differently among drawings even in the case where the same portion is illustrated.

In the specification and drawings, components similar to those described previously or illustrated in an antecedent drawing are marked with the same reference numerals; and a detailed description is omitted as appropriate.

First Embodiment

FIG. 1 is a block diagram schematically illustrating a power measurement device according to a first embodiment.

As illustrated in FIG. 1, the power measurement device 10 includes a three-phase to two-phase converter 12 (a first three-phase to two-phase converter), a three-phase to two-phase converter 14 (a second three-phase to two-phase converter), an instantaneous power calculator 16, a moving average calculator 18 (a first moving average calculator), a moving average calculator 20 (a second moving average calculator), an average value calculator 22 (a first average value calculator), and an average value calculator 24 (a second average value calculator).

The power measurement device 10 measures the average apparent power of a power system of three-phase AC power. For example, the power measurement device 10 is used to measure the average apparent power at a connection point of the power system and a distributed power source such as solar power generation, wind power generation, etc. However, the average apparent power that is measured by the power measurement device 10 is not limited thereto, and may be the average apparent power of any three-phase AC power.

Three-phase voltage signals $V_a$, $V_b$, and $V_c$ of the three-phase AC power are input to the three-phase to two-phase converter 12. The three-phase to two-phase converter 12 converts the three-phase voltage signals $V_a$, $V_b$, and $V_c$ into two-phase voltage signals $V_\alpha$ and $V_\beta$ of the α-phase and the β-phase by performing an α-β transformation (a Clarke transformation). The three-phase to two-phase converter 12 inputs the voltage signals $V_\alpha$ and $V_\beta$ after the conversion to the instantaneous power calculator 16.

The three-phase voltage signals $V_a$, $V_b$, and $V_c$ may be input to the three-phase to two-phase converter 12 from a voltmeter that measures the voltage at the connection point, etc., or may be input to the three-phase to two-phase converter 12 from a higher-level controller, etc. The method for inputting the three-phase voltage signals $V_a$, $V_b$, and $V_c$ to the three-phase to two-phase converter 12 may be any method that can appropriately input the three-phase voltage signals $V_a$, $V_b$, and $V_c$ to the three-phase to two-phase converter 12.

Three-phase current signals $I_a$, $I_b$, and $I_c$ of the three-phase AC power are input to the three-phase to two-phase converter 14. The three-phase to two-phase converter 14 converts the three-phase current signals $I_a$, $I_b$, and $I_c$ into two-phase current signals $I_\alpha$ and $I_\beta$ of the α-phase and the β-phase by performing an α-β transformation (a Clarke transformation). The three-phase to two-phase converter 14 inputs the current signals $I_\alpha$ and $I_\beta$ after the conversion to the instantaneous power calculator 16.

The three-phase current signals $I_a$, $I_b$, and $I_c$ may be input to the three-phase to two-phase converter 14 from an ammeter that measures the current at the connection point, etc., or may be input to the three-phase to two-phase converter 14 from a higher-level controller, etc. The method for inputting the three-phase current signals $I_a$, $I_b$, and $I_c$ to the three-phase to two-phase converter 14 may be any method that can appropriately input the three-phase current signals $I_a$, $I_b$, and $I_c$ to the three-phase to two-phase converter 14.

The instantaneous power calculator 16 calculates an instantaneous value $P_{inst}$ of the active power and an instantaneous value $Q_{inst}$ of the reactive power of the three-phase AC power based on the voltage signals $V_\alpha$ and $V_\beta$ input from the three-phase to two-phase converter 12 and the current signals $I_\alpha$ and $I_\beta$ input from the three-phase to two-phase converter 14. For example, the instantaneous power calculator 16 calculates the instantaneous value $P_{inst}$ of the active power by the following formula (A), and calculates the instantaneous value $Q_{inst}$ of the reactive power by formula (B).

$$P_{inst}=V_\alpha \cdot I_\alpha + V_\beta \cdot I_\beta \quad (A)$$

$$Q_{inst}=V_\alpha \cdot I_\beta - V_\beta \cdot I_\alpha \quad (B)$$

The instantaneous power calculator 16 inputs the calculated instantaneous value $P_{inst}$ of the active power to the moving average calculator 18, and inputs the calculated instantaneous value $Q_{inst}$ of the reactive power to the moving average calculator 20.

Figure 2A:
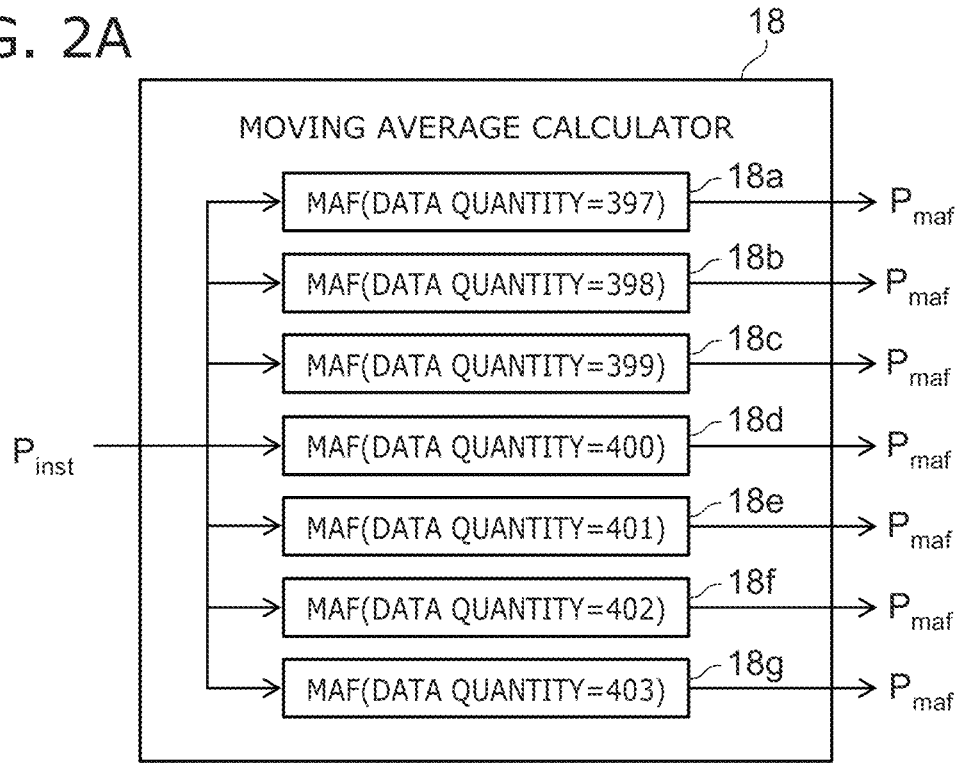
FIGS. 2A and 2B are block diagrams schematically illustrating the moving average calculators.
Figure 2B:
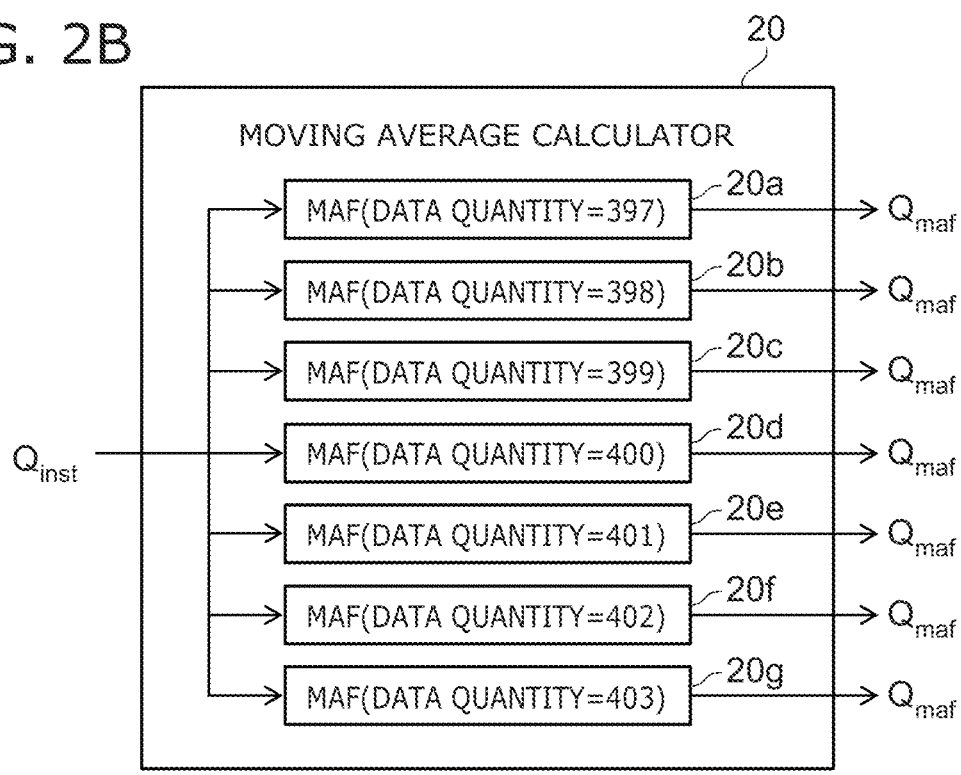

FIGS. 2A and 2B are block diagrams schematically illustrating the moving average calculators.

As illustrated in FIG. 2A, the moving average calculator 18 includes multiple moving average filters 18a to 18g (first moving average filters) that calculate moving averages and use different data quantities.

The moving average calculator 18 inputs the instantaneous value $P_{inst}$ of the active power input from the instantaneous power calculator 16 to each of the multiple moving average filters 18a to 18g, and causes the moving average filters 18a to 18g to respectively calculate multiple active power average values $P_{maf}$ of different moving average data quantities. The moving average calculator 18 inputs the multiple active power average values $P_{maf}$ respectively calculated by the moving average filters 18a to 18g to the average value calculator 22.

The data quantities of the multiple moving average filters 18a to 18g correlate with sampling periods when acquiring the frequency of the three-phase AC power and the data (the voltage signals $V_a$, $V_b$, and $V_c$ and the current signals $I_a$, $I_b$, and $I_c$).

It is favorable for the data quantities of the moving average filters 18a to 18g and the sampling periods to be set to values that acquire data of precisely one period of the three-phase AC power. In other words, it is favorable for the moving average filters 18*a* to 18*g* to calculate the moving average of the data (the instantaneous value $P_{inst}$ of the active power) of one period of the three-phase AC power.

For example, when the frequency of the three-phase AC power is 50 Hz and the sampling period is 50 s, the period of the three-phase AC power is 20000 s; it is therefore favorable for the data quantity to be 20000/50, i.e., 400. Thus, when the frequency of the three-phase AC power is 50 Hz and the sampling period is 50 s, 400 data points are acquired, and the moving average is calculated based on the 400 data points. The moving average of the data of one period of the three-phase AC power is calculated thereby, and the superimposition on the instantaneous value $P_{inst}$ of the active power of the fluctuation of components at the frequency of the three-phase AC power and the fluctuation of components at integer multiples of the frequency of the three-phase AC power can be suppressed.

For example, as illustrated in formula (A) and formula (B) recited above, the instantaneous value $P_{inst}$ of the active power and the instantaneous value $Q_{inst}$ of the reactive power are represented by the product of the voltage signals $V_\alpha$ and $V_\beta$ and the current signals $I_\alpha$ and $I_\beta$. Therefore, for example, when an imbalance occurs in the voltage signals $V_a$, $V_b$, and $V_c$ and the current signals $I_a$, $I_b$, and $I_c$, according to trigonometric identities, the instantaneous value $P_{inst}$ of the active power and the instantaneous value $Q_{inst}$ of the reactive power undesirably fluctuate at a frequency that is twice the frequency of the three-phase AC power. Thus, even when the instantaneous value $P_{inst}$ of the active power and the instantaneous value $Q_{inst}$ of the reactive power fluctuate at twice the frequency, the effects of the fluctuation can be suppressed as described above by calculating the moving average of the data of one period of the three-phase AC power. For example, even when a system disturbance such as an unbalanced state or the like occurs in the three-phase AC power, the effects of the system disturbance can be suppressed, and the fluctuation of the average value $P_{maf}$ of the active power caused by the system disturbance can be suppressed.

Thus, a data quantity L can be represented by the following formula (C), where L is the data quantities of the moving average filters 18*a* to 18*g*, T is one period of the three-phase AC power, and Δt is the sampling period of the data.

$$L = T/\Delta \quad (C)$$

It is favorable to set the sampling period Δt to be sufficiently small with respect to one period T of the three-phase AC power. For example, it is favorable to set the sampling period Δt to be not more than 1/10 of one period T of the three-phase AC power.

FIG. 2A shows an example in which the moving average calculator 18 includes the seven moving average filters 18*a* to 18*g* having the data quantities L respectively set to 397, 398, 399, 400, 401, 402, and 403. The moving average filter 18*a* that has the data quantity L set to 397 corresponds to a three-phase AC power frequency of 50.3778 Hz. The moving average filter 18*b* that has the data quantity L set to 398 corresponds to a three-phase AC power frequency of 50.2513 Hz. The moving average filter 18*c* that has the data quantity L set to 399 corresponds to a three-phase AC power frequency of 50.1253 Hz. The moving average filter 18*d* that has the data quantity L set to 400 corresponds to a three-phase AC power frequency of 50 Hz. The moving average filter 18*e* that has the data quantity L set to 401 corresponds to a three-phase AC power frequency of 49.8753 Hz. The moving average filter 18*f* that has the data quantity L set to 402 corresponds to a three-phase AC power frequency ωf 49.7512 Hz. The moving average filter 18*g* that has the data quantity L set to 403 corresponds to a three-phase AC power frequency of 49.6278 Hz.

When the frequency of the three-phase AC power is 50 Hz, the fluctuation of the average value $P_{maf}$ of the active power can be suppressed as described above by using the calculation result of the moving average filter 18*d* having the data quantity L set to 400. On the other hand, when the frequency of the three-phase AC power fluctuates from 50 Hz, it is difficult to appropriately suppress the fluctuation of the average value $P_{maf}$ of the active power even when using the calculation result of the moving average filter 18*d*.

Therefore, the moving average calculator 18 prepares the multiple moving average filters 18*a* to 18*g* that calculate moving averages by using different data quantities. Thereby, the moving average calculator 18 can adapt to multiple frequencies of the three-phase AC power. For example, the calculation results of the other moving average filters 18*a* to 18*c* and 18*e* to 18*g* are used when the frequency of the three-phase AC power fluctuates from 50 Hz. Thereby, the moving average calculator 18 can suppress the fluctuation of the average value $P_{maf}$ of the active power even when the frequency of the three-phase AC power fluctuates.

The data quantities L set for the multiple moving average filters 18*a* to 18*g* are not limited to those described above. For the multiple moving average filters 18*a* to 18*g*, it is sufficient for at least a data quantity L that corresponds to the nominal frequency of the three-phase AC power (in the example, 400) to be set for one of the moving average filters 18*a* to 18*g*.

For example, it is favorable to set the data quantities L of the multiple moving average filters 18*a* to 18*g* to be on the high frequency side and the low frequency side of the nominal frequency of the three-phase AC power, such as the three-phase AC power nominal frequency ±1, ±2, . . . , ±n as in the example described above. Thereby, fluctuation on the high side and fluctuation on the low side of the frequency of the three-phase AC power can be appropriately adapted to. However, the method for setting the data quantities L of the moving average filters 18*a* to 18*g* is not limited to that described above, and may be any method. For example, when a tendency of the fluctuation of the frequency of the three-phase AC power, such as the fluctuation on the high frequency side being large, is known beforehand, etc., the setting of the data quantities L may be biased to the high or low frequency side. Also, the number of moving average filters located in the moving average calculator 18 is not limited to seven and may be any number.

As illustrated in FIG. 2B, the moving average calculator 20 includes multiple moving average filters 20*a* to 20*g* (second moving average filters) that calculate moving averages by using different data quantities.

The moving average calculator 20 inputs the instantaneous value $Q_{inst}$ of the reactive power input from the instantaneous power calculator 16 to each of the multiple moving average filters 20*a* to 20*g* and causes the moving average filters 20*a* to 20*g* to respectively calculate multiple reactive power average values $Q_{maf}$ by using different moving average data quantities. The moving average calculator 20 inputs the multiple reactive power average values $Q_{maf}$ respectively calculated by the moving average filters 20*a* to 20*g* to the average value calculator 24. The configuration of the moving average calculator 20 is similar to the configuration of the moving average calculator 18, and a detailed description is therefore omitted below.

FIGS. 3A to 3F are graphs schematically illustrating an example of the operation of the power measurement device according to the first embodiment.

Figure 3A:
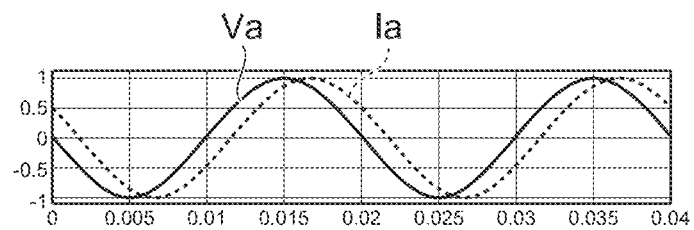
FIGS. 3A to 3F are graphs schematically illustrating an example of the operation of the power measurement device according to the first embodiment.

FIG. 3A schematically illustrates an example of the voltage signal $V_a$ and the current signal $I_a$.

Figure 3B:
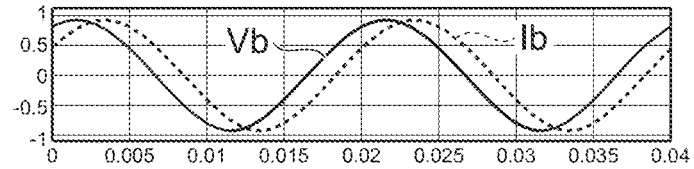

FIG. 3B schematically illustrates an example of the voltage signal $V_b$ and the current signal $I_b$.

Figure 3C:
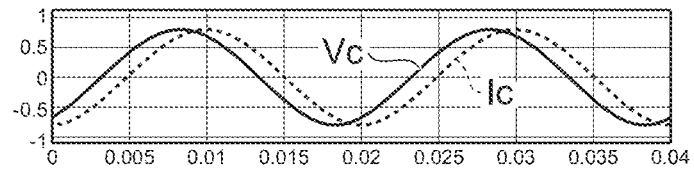

FIG. 3C schematically illustrates an example of the voltage signal $V_c$ and the current signal $I_c$.

Figure 3D:
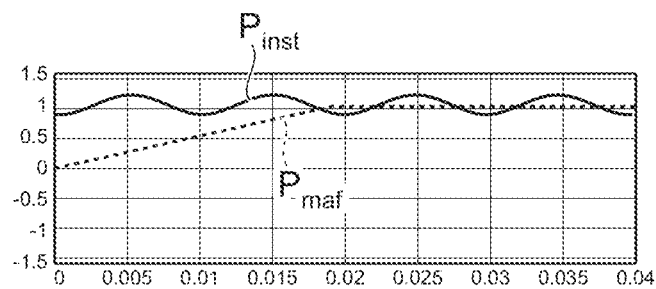

FIG. 3D schematically illustrates an example of the instantaneous value $P_{inst}$ of the active power calculated by the instantaneous power calculator 16 and the average value $P_{maf}$ of the active power calculated by the multiple moving average filters 18a to 18g of the moving average calculator 18.

Figure 3E:
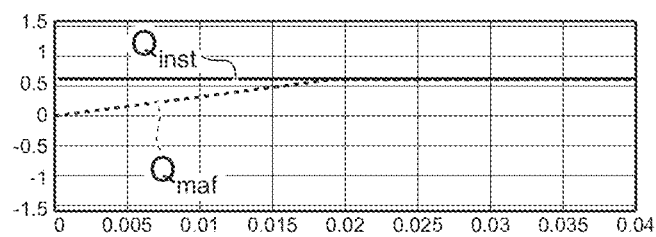

FIG. 3E schematically illustrates an example of the instantaneous value $Q_{inst}$ of the reactive power calculated by the instantaneous power calculator 16 and the average value $Q_{maf}$ of the reactive power calculated by the multiple moving average filters 20a to 20g of the moving average calculator 20.

Figure 3F:
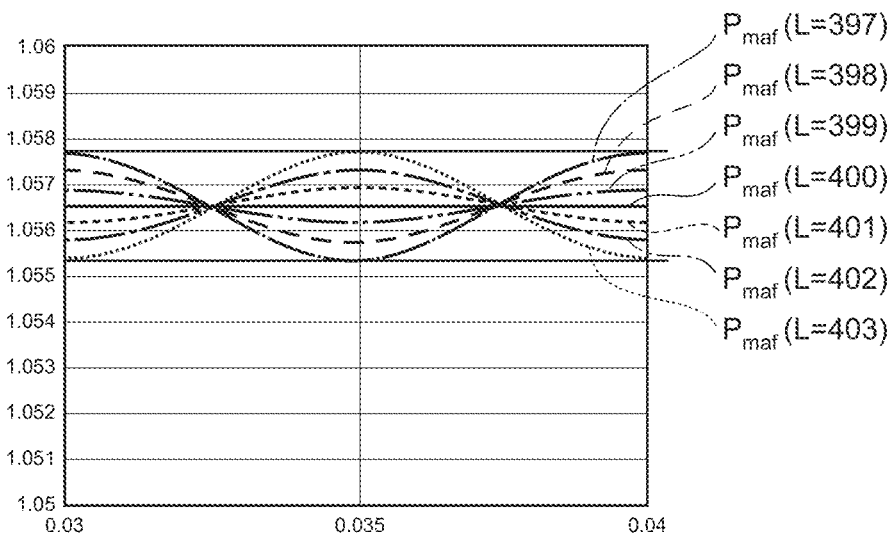

FIG. 3F schematically illustrates an example of the average value $P_{maf}$ of the active power calculated by the multiple moving average filters 18a to 18g of the moving average calculator 18.

In the example as illustrated in FIGS. 3A to 3C, an example of an unbalanced state is illustrated in which the voltage signal $V_a=1$ pu (Per Unit), the voltage signal $V_b=0.9$ pu, the voltage signal $V_c=0.8$ pu, the current signal $I_a=1$ pu, the current signal $I_b=0.9$ pu, and the current signal $I_c=0.8$ pu. Also, in the example, the frequency of the voltage signals $V_a$, $V_b$, and $V_c$ and the current signals $I_a$, $I_b$, and $I_c$ is 50 Hz.

Due to the unbalanced state as illustrated in FIG. 3D, an oscillating component of 100 Hz appears in the instantaneous value $P_{inst}$ of the active power. Conversely, in the average value $P_{maf}$ of the active power, the oscillating component of the instantaneous value $P_{inst}$ of the active power can be suppressed after 20 ms of data.

In FIG. 3D, the average values $P_{maf}$ of the active power calculated by the multiple moving average filters 18a to 18g are superimposed and appear as one line. Similarly, in FIG. 3E, the average values $Q_{maf}$ of the reactive power calculated by the multiple moving average filters 20a to 20g are superimposed and appear as one line.

FIG. 3F is an enlarged illustration of a portion of the average values $P_{maf}$ of the active power of the moving average filters 18a to 18g illustrated in FIG. 3D from 20 ms. In the example as illustrated in FIG. 3F, the frequency of the voltage signals $V_a$, $V_b$, and $V_c$ and the current signals $I_a$, $I_b$, and $I_c$ is 50 Hz; therefore, the oscillating component of the instantaneous value $P_{inst}$ of the active power is best suppressed for the average value $P_{maf}$ of the active power calculated by the moving average filter 18d having the data quantity L set to 400. Also, it can be seen that the remaining effects of the oscillating component of the instantaneous value $P_{inst}$ of the active power undesirably increase away from the data quantity L of 400.

Thus, the fluctuation of the component having twice the frequency of the three-phase AC power superimposed onto the instantaneous value $P_{inst}$ of the active power can be appropriately suppressed by calculating the moving average of the data of one period of the three-phase AC power.

The multiple active power average values $P_{maf}$ from the moving average calculator 18 is input to the average value calculator 22, and frequency information f representing the frequency of the three-phase AC power is input to the average value calculator 22. For example, the frequency information f is input to the average value calculator 22 from an external frequency detector, a higher-level controller, or the like via a network, etc.

The average value calculator 22 calculates an average value $P_{ave}$ of the active power corresponding to the frequency of the three-phase AC power based on the frequency information f and the multiple active power average values $P_{maf}$ input from the moving average calculator 18.

Figure 4:
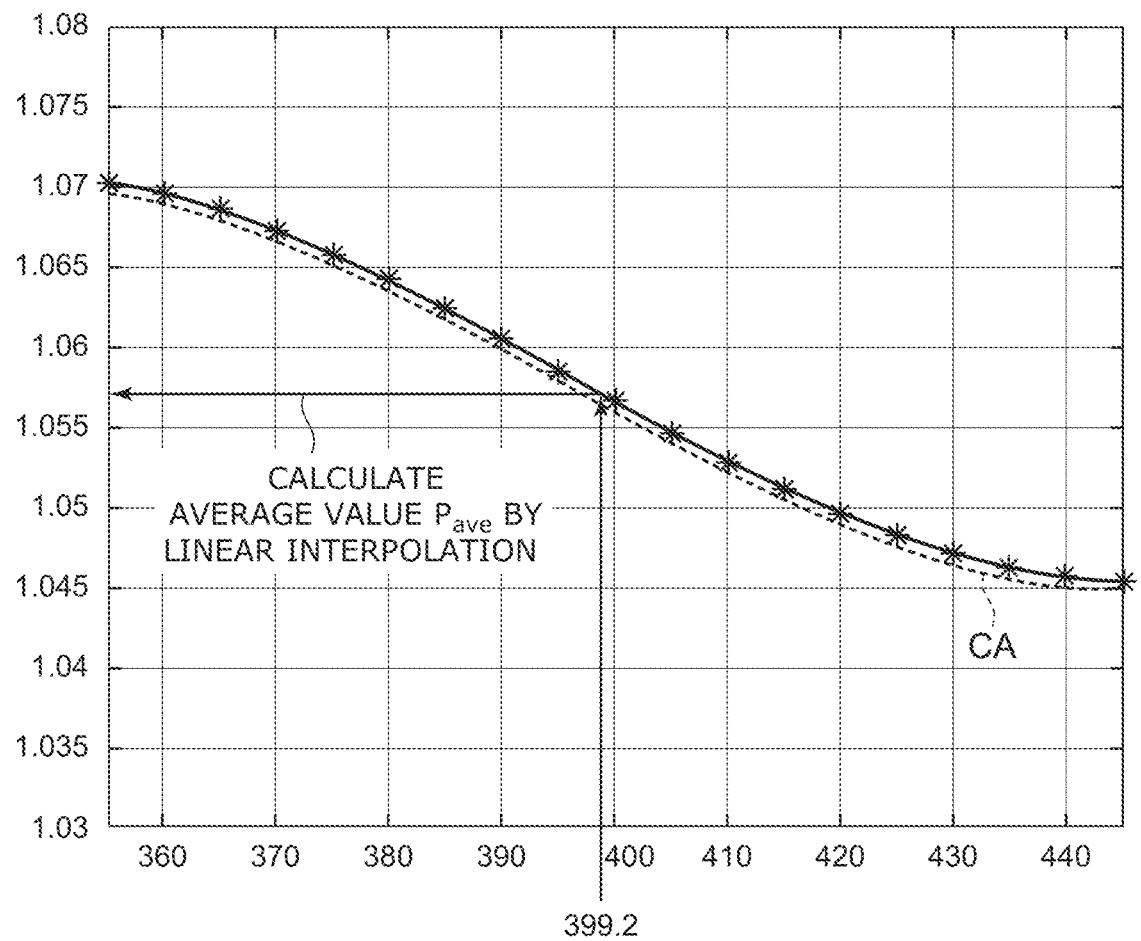
FIG. 4 is a graph schematically illustrating an example of the operation of the average value calculator.

FIG. 4 is a graph schematically illustrating an example of the operation of the average value calculator.

FIG. 4 illustrates an example of the relationship between the data quantity L (the frequency of the three-phase AC power) and the average value $P_{maf}$ of the active power calculated by the moving average calculator 18. In the example illustrated in FIG. 4, an example is illustrated in which the moving average calculator 18 calculates more average values $P_{maf}$ of the active power than the example illustrated in FIG. 2A. FIG. 4 illustrates an example in which nineteen average values $P_{maf}$ of the active power are calculated.

As illustrated in FIG. 4, the average values $P_{maf}$ of the active power calculated by the moving average calculator 18 are acquired as discrete data corresponding to prescribed data quantities L. Therefore, when the current frequency of the three-phase AC power is between the data quantities L, it is difficult to appropriately suppress the fluctuation of the component having twice the frequency of the three-phase AC power superimposed onto the instantaneous value $P_{inst}$ of the active power based on the calculation results of the moving average calculator 18.

On the other hand, as illustrated in FIG. 4, the change of the average value $P_{maf}$ of the active power between the data quantities L is determined to be continuous and monotonous between the average values $P_{maf}$ of the active power of the data quantities L.

Therefore, the average value calculator 22 calculates the average value $P_{ave}$ of the active power corresponding to the frequency of the three-phase AC power by selecting a prescribed number of active power average values $P_{maf}$ at frequencies (data quantities L) near the frequency represented by the frequency information f among the multiple active power average values $P_{maf}$ calculated by the moving average calculator 18, and by performing a linear interpolation of the selected prescribed number of active power average values $P_{maf}$. It is favorable for the prescribed number to be, for example, about two or three. However, the prescribed number is not limited thereto; it is sufficient for the prescribed number to be any number corresponding to the settings such as the sampling period Δt, the data quantities L, etc.

For example, when the frequency represented by the frequency information f is 50.1 Hz, the corresponding data quantity L is about 399.2 according to formula (C) described above. In such a case, for example, the average value calculator 22 calculates the average value $P_{ave}$ of the active power corresponding to the frequency of the three-phase AC power by selecting the average value $P_{maf}$ of the active power of the data quantity L=395 and the average value $P_{maf}$ of the active power of the data quantity L=400 in FIG. 4, and by performing linear interpolation of the selected two average values $P_{maf}$ of the active power. Thereby, the average value $P_{ave}$ of the active power can be obtained in which the fluctuation of the component having twice the frequency of the three-phase AC power superimposed onto the instantaneous value $P_{inst}$ of the active power is appropriately suppressed, even when the frequency of the three-phase AC power fluctuates and the current frequency of the three-phase AC power is between the data quantities L.

The method for calculating the average value $P_{ave}$ of the active power by the average value calculator 22 is not limited to that described above. For example, as illustrated by the broken line in FIG. 4, an approximate curve CA of the multiple active power average values $P_{maf}$ calculated by the moving average calculator 18 may be calculated, and the average value $P_{ave}$ of the active power may be calculated based on the approximate curve CA.

However, in such a case, there is a possibility that the calculation of the approximate curve CA may become complex, and a deviation in the power value may undesirably occur at some portion of the multiple active power average values $P_{maf}$. As described above, the average value $P_{ave}$ of the active power corresponding to the frequency of the three-phase AC power is calculated by selecting a prescribed number of active power average values $P_{maf}$ having frequencies near the frequency represented by the frequency information f among the multiple active power average values $P_{maf}$ calculated by the moving average calculator 18, and by performing a linear interpolation of the selected prescribed number of active power average values $P_{maf}$. Thereby, the average value $P_{ave}$ of the active power can be more appropriately calculated by a relatively simple calculation.

The multiple reactive power average values $Q_{maf}$ from the moving average calculator 20 are input to the average value calculator 24, and the frequency information f representing the frequency of the three-phase AC power is input to the average value calculator 24. Similarly to the average value calculator 22, the average value calculator 24 calculates an average value $Q_{ave}$ of the reactive power corresponding to the frequency of the three-phase AC power based on the frequency information f and the multiple reactive power average values $Q_{maf}$ input from the moving average calculator 20.

Thereby, the average value $Q_{ave}$ of the reactive power can be obtained in which the fluctuation of the component having twice the frequency of the three-phase AC power superimposed is the instantaneous value $Q_{inst}$ of the reactive power is appropriately suppressed even when the frequency of the three-phase AC power fluctuates and the current frequency of the three-phase AC power is between the data quantities L.

Thus, in the power measurement device 10 according to the embodiment, the average value $P_{ave}$ of the active power and the average value $Q_{ave}$ of the reactive power can be obtained in which the fluctuation is appropriately suppressed even when frequency fluctuation occurs in the presence of a system disturbance. Accordingly, according to the power measurement device 10 according to the embodiment, the average apparent power can be more accurately measured based on the average value $P_{ave}$ of the active power and the average value $Q_{ave}$ of the reactive power even when frequency fluctuation occurs in the presence of a system disturbance. The average apparent power can be measured using the formula of $S^2 = P_{ave}^2 + Q_{ave}^2$, where S is the average apparent power.

Second Embodiment

Figure 5:
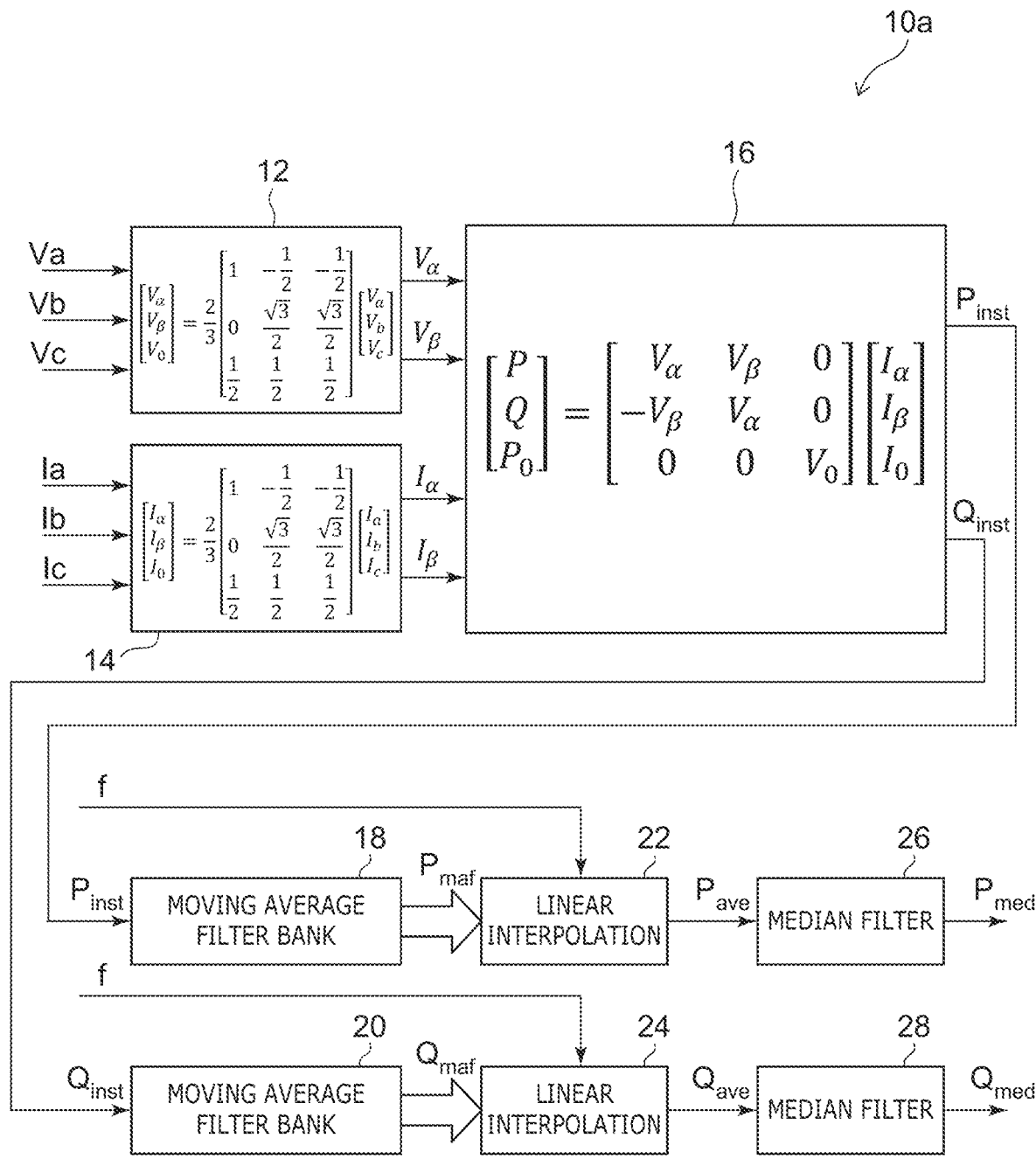
FIG. 5 is a block diagram schematically illustrating a power measurement device according to a second embodiment.

FIG. 5 is a block diagram schematically illustrating a power measurement device according to a second embodiment.

As illustrated in FIG. 5, the power measurement device 10*a* further includes a median filter 26 (a first median filter) and a median filter 28 (a second median filter). Components that are substantially the same in function and configuration as those of the first embodiment described above are marked with the same reference numerals, and a detailed description is omitted.

The average value $P_{ave}$ of the active power calculated by the average value calculator 22 is input to the median filter 26. The median filter 26 calculates a median value $P_{med}$ of a prescribed number of active power average values $P_{ave}$ calculated by the average value calculator 22.

The average value $Q_{ave}$ of the reactive power calculated by the average value calculator 24 is input to the median filter 28. Similarly to the median filter 26, the median filter 28 calculates a median value $Q_{med}$ of a prescribed number of reactive power average values $Q_{ave}$ calculated by the average value calculator 24.

The prescribed numbers used by the median filters 26 and 28 to calculate the median values $P_{med}$ and $Q_{med}$ are, for example, about 10 to 20. However, the prescribed numbers are not limited thereto and may be any number. The prescribed numbers are not necessarily the same between the median filters 26 and 28, and may be different.

Figure 6:
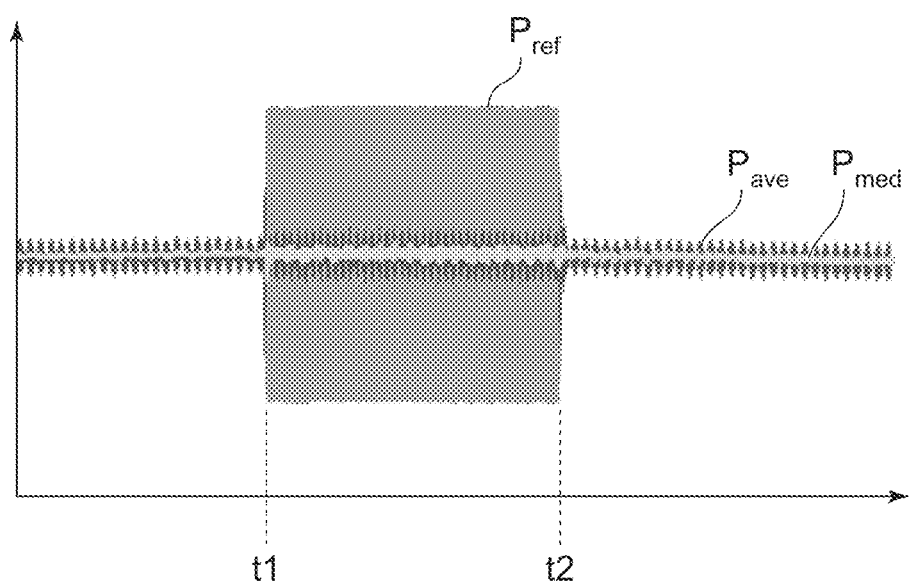
FIG. 6 is a block diagram schematically illustrating an example of the operation of the power measurement device according to the second embodiment.

FIG. 6 is a block diagram schematically illustrating an example of the operation of the power measurement device according to the second embodiment.

FIG. 6 schematically illustrates an example of the average value $P_{ave}$ of the active power calculated by the average value calculator 22, the median value $P_{med}$ of the average value $P_{ave}$ of the active power calculated by the median filter 26, and a reference average value $P_{ref}$ of the active power. The reference average value $P_{ref}$ of the active power is the moving average value of the active power calculated by a moving average filter using a data quantity L corresponding to the nominal frequency of the three-phase AC power.

FIG. 6 schematically illustrates an example of the operation of the power measurement device 10*a* when an unbalanced state occurs in which the voltage and the current of one phase among the three-phase AC power are zero, and the frequency fluctuates from 50 Hz to 51 Hz between a timing t1 and a timing t2.

As illustrated in FIG. 6, the reference average value $P_{ref}$ of the active power for which the data quantity L of the moving average filter is fixed greatly fluctuates between the timing t1 and the timing t2 in which the fluctuation of the frequency occurs.

Conversely, compared to the reference average value $P_{ref}$ of the active power, the fluctuation can be appropriately suppressed for the average value $P_{ave}$ of the active power calculated by the average value calculator 22 even between the timing t1 and the timing t2 when the fluctuation of the frequency occurs. Also, compared to the average value $P_{ave}$ of the active power, the fluctuation can be better suppressed for the median value $P_{med}$ of the average value $P_{ave}$ of the active power calculated by the median filter 26 between the timing t1 and the timing t2 when the fluctuation of the frequency occurs.

Thus, the power measurement device 10*a* further includes the median filters 26 and 28, and calculates the median value $P_{med}$ of the average value $P_{ave}$ of the active power and the median value $Q_{med}$ of the average value $Q_{ave}$ of the reactive power. Thereby, in the power measurement device 10*a* according to the embodiment, the average apparent power can be more accurately measured based on the median value $P_{med}$ of the average value $P_{ave}$ of the active power and the median value $Q_{med}$ of the average value $Q_{ave}$ of the reactive power even when frequency fluctuation occurs in the presence of a system disturbance.

Third Embodiment

Figure 7:
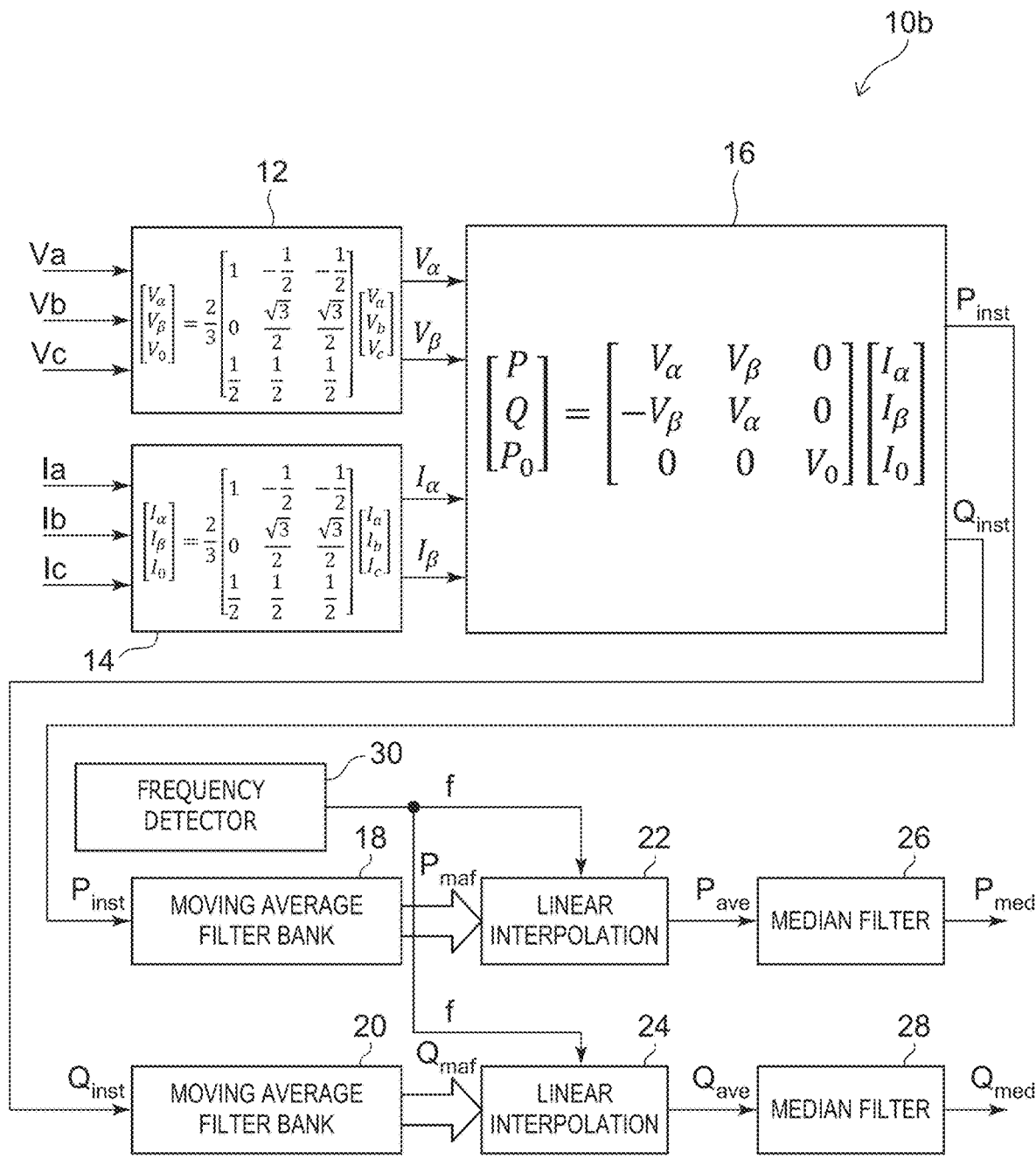
FIG. 7 is a block diagram schematically illustrating a power measurement device according to a third embodiment.

FIG. 7 is a block diagram schematically illustrating a power measurement device according to a third embodiment.

As illustrated in FIG. 7, the power measurement device 10b further includes a frequency detector 30. The frequency detector 30 detects the frequency of the three-phase AC power and inputs the frequency information f of the detected frequency to the average value calculators 22 and 24.

In the power measurement device 10b, the average value calculator 22 calculates the average value $P_{ave}$ of the active power corresponding to the frequency of the three-phase AC power based on the multiple active power average values $P_{maf}$ input from the moving average calculator 18 and the frequency information f input from the frequency detector 30. Similarly, the average value calculator 24 calculates the average value $Q_{ave}$ of the reactive power corresponding to the frequency of the three-phase AC power based on the multiple reactive power average values $Q_{maf}$ input from the moving average calculator 18 and the frequency information f input from the frequency detector 30.

Figure 8:
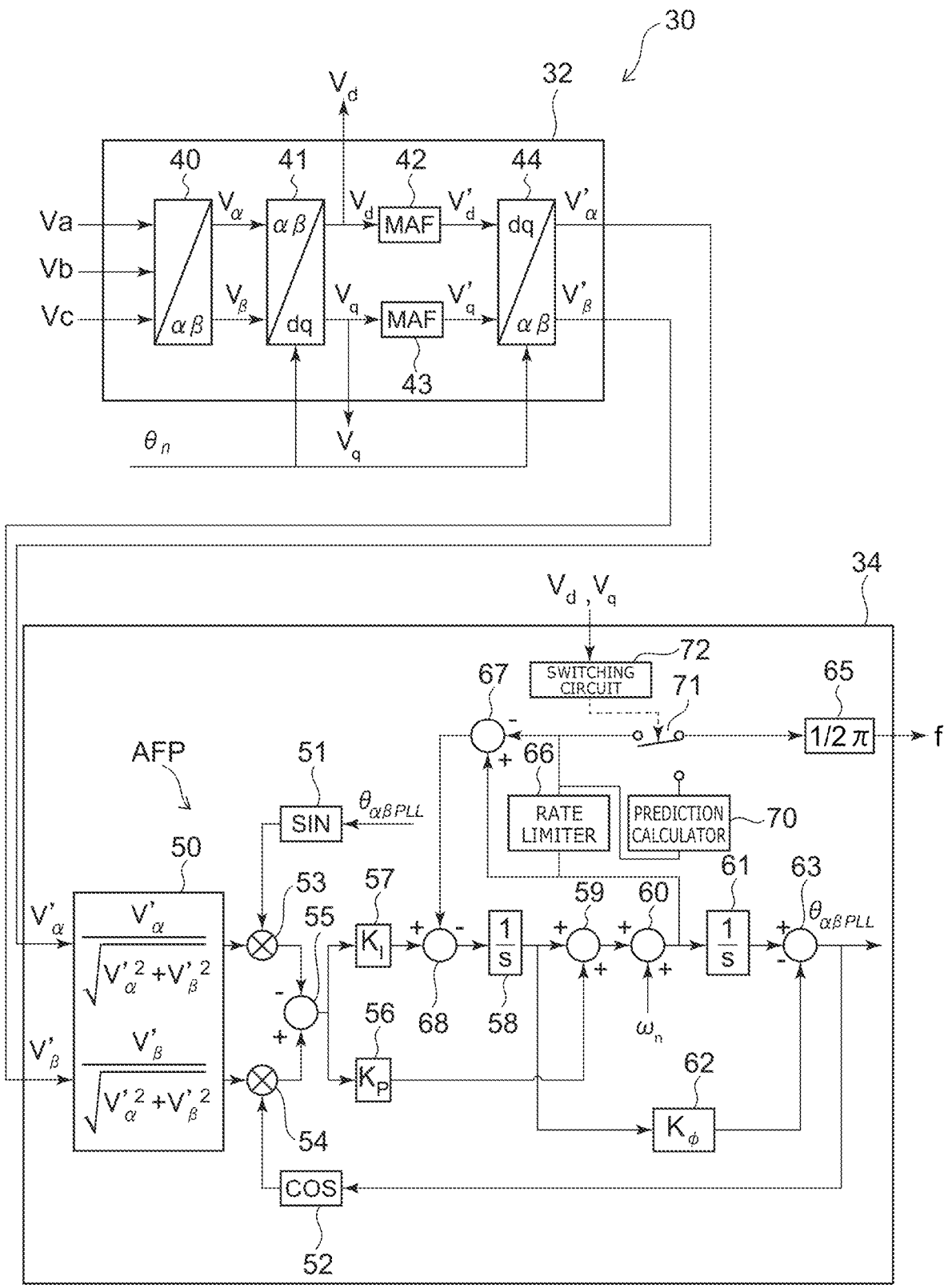
FIG. 8 is a block diagram schematically illustrating the frequency detector.

FIG. 8 is a block diagram schematically illustrating the frequency detector.

As illustrated in FIG. 8, the frequency detector 30 includes an orthogonal coordinate signal generator 32 and a frequency calculator 34. The frequency detector 30 detects the frequency of the power system of the three-phase AC power.

The orthogonal coordinate signal generator 32 generates orthogonal two-phase voltage signals $V_\alpha'$ and $V_\beta'$ from the three-phase voltage signals $V_a$, $V_b$, and $V_c$ of the three-phase AC power. For example, the three-phase voltage signals $V_a$, $V_b$, and $V_c$ are detected by a voltage detector or the like, and are input to the orthogonal coordinate signal generator 32. The three-phase voltage signals $V_a$, $V_b$, and $V_c$ are, for example, instantaneous values of a three-phase AC voltage input at a prescribed sampling period.

The orthogonal coordinate signal generator 32 includes a three-phase to two-phase converter 40, a rotating coordinate converter 41, moving average filters 42 and 43, and an inverse converter 44.

The three-phase to two-phase converter 40 converts the three-phase voltage signals $V_a$, $V_b$, and $V_c$ into the two-phase voltage signals $V_\alpha$ and $V_\beta$ of the α-phase and the β-phase by performing an α-β transformation (a Clarke transformation).

The two-phase voltage signals $V_\alpha$ and $V_\beta$ are input to the rotating coordinate converter 41, and a nominal phase $\theta_n$ obtained by integrating a nominal angular frequency $\omega_n$ of the power system is input to the rotating coordinate converter 41. The rotating coordinate converter 41 performs a rotating coordinate transformation of the voltage signals $V_\alpha$ and $V_\beta$ of the orthogonal two-axis coordinates into voltage signals $V_d$ and $V_q$ of a coordinate system (dq coordinates) synchronized with the phase $\theta_n$ by a so-called dq transformation (a Park transformation). The voltage signal $V_d$ is a voltage signal of the d-axis component of the three-phase AC power (the voltage signals $V_a$, $V_b$, and $V_c$); and the voltage signal $V_q$ is a voltage signal of the q-axis component of the three-phase AC power (the voltage signals $V_a$, $V_b$, and $V_c$) of the power system.

The moving average filter 42 outputs a voltage signal $V_d'$ after the moving average calculation by calculating the moving average of the voltage signal $V_d$. Similarly, the moving average filter 43 outputs a voltage signal $V_q'$ after the moving average calculation by calculating the moving average of the voltage signal $V_q$. Thus, the moving average filters 42 and 43 suppress the high frequency components of the voltage signals $V_d$ and $V_q$ by calculating the moving averages of the voltage signals $V_d$ and $V_q$. For example, the moving average filters 42 and 43 suppress the harmonic components included in the voltage signals $V_d$ and $V_q$. For example, undesirable effects on the detection of the frequency due to trouble at the power system side such as voltage imbalance of the three phases, harmonics, noise, etc., can be suppressed thereby.

By performing an inverse transformation of the voltage signals $V_d'$ and $V_q'$ of the rotating coordinate system into an orthogonal two-axis coordinate system, the inverse converter 44 converts the voltage signals $V_d'$ and $V_q'$ into the voltage signals $V_\alpha'$ and $V_\beta'$ of the orthogonal two-axis coordinates after the moving average calculation. Thereby, the orthogonal coordinate signal generator 32 generates the orthogonal two-phase voltage signals $V_\alpha'$ and $V_\beta'$ from the three-phase voltage signals $V_a$, $V_b$, and $V_c$.

The frequency calculator 34 calculates the frequency information f based on the two-phase voltage signals $V_\alpha'$ and $V_\beta'$ generated by the orthogonal coordinate signal generator 32. By using a PLL (Phase-Locked-Loop) calculation, the frequency calculator 34 detects a synchronous phase $\theta_{\alpha\beta PLL}$ synchronized with the voltage signals $V_\alpha'$ and $V_\beta'$ after the two-phase conversion and calculates the frequency information f from an angular frequency ω obtained in the detection process of the synchronous phase $\theta_{\alpha\beta PLL}$.

The frequency calculator 34 includes an angular frequency calculator AFP. The angular frequency calculator AFP includes, for example, arithmetic units 50, 51, and 52, multipliers 53 and 54, a subtractor 55, arithmetic units 56 and 57, an integrator 58, adders 59 and 60, an integrator 61, an arithmetic unit 62, and a subtractor 63.

The arithmetic unit 50 calculates $\cos\theta_n$ and $\sin\theta_n$ from the two-phase voltage signals $V_\alpha'$ and $V_\beta'$. The arithmetic unit 50 calculates $\cos\theta_n$ by using the formula $V_\alpha'/\sqrt{(V_\alpha'^2 + V_\beta'^2)}$, and calculates $\sin\theta_n$ by using the formula $V_\beta'/\sqrt{(V_\alpha'^2 + V_\beta'^2)}$. The arithmetic unit 50 inputs the calculated $\cos\theta_n$ to the multiplier 53, and inputs the calculated $\sin\theta_n$ to the multiplier 54.

The arithmetic unit 51 calculates $\sin\theta_{\alpha\beta PLL}$ based on the detected synchronous phase $\theta_{\alpha\beta PLL}$, and inputs $\sin\theta_{\alpha\beta PLL}$ to the multiplier 53.

The arithmetic unit 52 calculates $\cos\theta_{\alpha\beta PLL}$ based on the detected synchronous phase $\theta_{\alpha\beta PLL}$, and inputs $\cos\theta_{\alpha\beta PLL}$ to the multiplier 54.

The multiplier 53 multiplies the input $\cos\theta_n$ and $\sin\theta_{\alpha\beta PLL}$ and inputs the multiplication result to the subtractor 55.

The multiplier 54 multiplies the input $\sin\theta_n$ and $\cos\theta_{\alpha\beta PLL}$ and inputs the multiplication result to the subtractor 55.

The subtractor 55 calculates an error phase Δθ between the phase $\theta_n$ of the power system and the synchronous phase $\theta_{\alpha\beta PLL}$ by calculating $\sin\theta_n \cdot \cos\theta_{\alpha\beta PLL} - \cos\theta_n \cdot \sin\theta_{\alpha\beta PLL}$. The frequency calculator 34 calculates the error phase Δθ as $$\Delta\theta = \theta_n - \theta_{\alpha\beta PLL} \approx \sin\theta_n \cdot \cos\theta_{\alpha\beta PLL} - \cos\theta_n \cdot \sin\theta_{\alpha\beta PLL}.$$

The arithmetic unit 56 multiplies the error phase Δθ by a proportional gain $K_P$ and inputs the multiplication result to the adder 59.

The arithmetic unit 57 multiplies the error phase Δθ by an integral gain $K_I$ and inputs the multiplication result to the integrator 58.

The integrator 58 integrates the multiplication result of the error phase Δθ and the integral gain $K_I$ and inputs the integral to the adder 59.

The adder 59 adds the integral of the multiplication result of the arithmetic unit 56 and the integrator 58. The arithmetic units 56 and 57, the integrator 58, and the adder 59 calculate a command value Δω of the angular frequency for setting the error phase Δθ to zero by a so-called proportional-integral control.

The command value Δω of the angular frequency calculated by the adder 59 is input to the adder 60, and the nominal angular frequency ωn of the power system is input to the adder 60. The adder 60 calculates the angular frequency ω of the power system by adding the command value Δω of the angular frequency and the nominal angular frequency $ω_n$ of the power system. Thus, the angular frequency calculator AFP calculates the angular frequency ω by performing the proportional-integral control based on the two-phase voltage signals $V_α'$ and $V_β'$.

The integrator 61 calculates a synchronous phase θ from the angular frequency ω by integrating the angular frequency ω calculated by the adder 60. The integrator 61 inputs the calculated synchronous phase θ to the subtractor 63.

The arithmetic unit 62 calculates a correction value by multiplying the integration result of the integrator 58 by a constant $K_φ$. The constant $K_φ$ is determined by $K_φ=(T_ω-T_{SP})/2$. $T_{SP}$ is the sampling period of the voltage signals $V_a$, $V_b$, and $V_c$. $T_ω$ is the window length of the moving average filters 42 and 43. $T_ω$ is represented by $N·T_{SP}$, where N is the averaging number of the moving average filters 42 and 43. The arithmetic unit 62 inputs the calculated correction value to the subtractor 63.

The subtractor 63 corrects the synchronous phase θ by subtracting the correction value from the synchronous phase θ. The subtractor 63 calculates the synchronous phase $θ_{αβPLL}$ by the correction.

The angular frequency calculator AFP synchronizes the synchronous phase $θ_{αβPLL}$ with the phase $θ_n$ of the power system by feeding back the detected synchronous phase $θ_{αβPLL}$ to the arithmetic units 51 and 52. Thus, based on the angular frequency ω, the angular frequency calculator AFP detects the synchronous phase $θ_{αβPLL}$ synchronized with the two-phase voltage signals $V_α'$ and $V_β'$ after calculating the moving averages, calculates the error phase Δθ between the nominal phase $θ_n$ of the power system and the synchronous phase $θ_{αβPLL}$, and calculates the angular frequency ω to cause the error phase Δθ to be zero. For example, the configuration of the PLL of the angular frequency calculator AFP (the frequency calculator 34) of the example may be called an αβEPMAFPLL (αβ Enhanced Pre-filtering Moving Average Filter PLL).

The frequency calculator 34 further includes an arithmetic unit 65, a rate limiter 66, subtractors 67 and 68, a prediction calculator 70, a switching element 71, and a switching circuit 72. The frequency calculator 34 calculates the frequency information f from the calculated angular frequency ω. The adder 60 inputs the calculated angular frequency ω to the integrator 61 and inputs the angular frequency ω to the rate limiter 66.

The rate limiter 66 limits a change of the frequency information f equal to or greater than a prescribed change rate by limiting a change of the angular frequency ω equal to or greater than a prescribed change rate. For example, the rate limiter 66 suppresses the change of the frequency information f equal to or greater than 4 Hz/sec.

Thus, by providing the rate limiter 66, even when a phase jump or the like occurs in the three-phase AC power, an abrupt fluctuation of the frequency information f can be suppressed, and the error of the calculation of the frequency information f can be reduced.

The subtractor 67 is connected with the input and output sides of the rate limiter 66. The subtractor 67 subtracts the output value of the rate limiter 66 from the input value of the rate limiter 66. In other words, the subtractor 67 calculates the difference between the input value and the output value of the rate limiter 66. The difference is calculated by the subtractor 67 when the calculated value of the angular frequency ω abruptly increases, the angular frequency ω is limited by the rate limiter 66, and the output value of the rate limiter 66 drops below the input value of the rate limiter 66. The subtractor 67 inputs the calculation result of the difference to the subtractor 68.

The subtractor 68 is located between the arithmetic unit 57 and the integrator 58 of the angular frequency calculator AFP. The subtractor 68 subtracts the calculation result of the difference of the subtractor 67 from the multiplication result of the arithmetic unit 57 multiplying the error phase Δθ by the integral gain $K_I$. In other words, when the rate limiter 66 limits the angular frequency ω, the subtractor 68 subtracts the amount limited by the rate limiter 66 from the calculation of the integration operation of the proportional-integral control.

Thus, in the frequency calculator 34, the subtractors 67 and 68 are included and feed back the output-input difference of the rate limiter 66 to the calculation of the proportional-integral control of the angular frequency calculator AFP. Even when a phase jump or the like occurs in the three-phase AC power, an abrupt fluctuation of the frequency information f can be more reliably suppressed thereby, and the error of the calculation of the frequency information f can be further reduced. For example, such control of the feedback may be called anti reset wind up.

The prediction calculator 70 is arranged in series with the rate limiter 66. The prediction calculator 70 calculates a predicted value ω' of the angular frequency ω after a prescribed time interval has elapsed based on the angular frequency ω output from the rate limiter 66 and the derivative of the angular frequency ω.

The switching element 71 selectively switches between the state in which only the rate limiter 66 is connected in series to the arithmetic unit 65 and the state in which the rate limiter 66 and the prediction calculator 70 are connected in series to the arithmetic unit 65. At this time, when the switching element 71 is in either state, the output of the rate limiter 66 is input to the subtractor 67; and the output-input difference of the rate limiter 66 is fed back to the calculation of the proportional-integral control of the angular frequency calculator AFP.

The switching circuit 72 selectively switches between a first state in which the angular frequency ω output from the rate limiter 66 is input to the arithmetic unit 65, and a second state in which the predicted value ω' output from the prediction calculator 70 is input to the arithmetic unit 65. For example, the switching circuit 72 selectively switches between the first state and the second state by controlling the switching of the path by the switching element 71.

However, switching between the first state and the second state is not limited thereto. For example, the first state may be taken to be when only the rate limiter 66 operates; and the second state may be taken to be when the rate limiter 66 and the prediction calculator 70 operate. In such a case, the switching element 71 is omissible.

The voltage signal $V_d$ of the d-axis component and the voltage signal $V_q$ of the q-axis component that are calculated by the rotating coordinate converter 41 of the orthogonal coordinate signal generator 32 are input to the switching circuit 72. The switching circuit 72 detects a phase jump of the power system based on the input voltage signals $V_d$ and $V_q$. In the state in which the phase jump of the power system is not detected, the switching circuit 72 selects the first state and inputs the angular frequency ω to the arithmetic unit 65. Then, when the phase jump of the power system is detected, the switching circuit 72 selects the second state for a constant interval, and inputs the predicted value ω' to the arithmetic unit 65 for the constant interval. The switching circuit 72 returns from the second state to the first state after the constant interval has elapsed.

The arithmetic unit 65 calculates the frequency information f from the angular frequency ω or the predicted value ω' by multiplying the angular frequency ω or the predicted value ω' of the angular frequency ω by ½π.

Thus, the frequency calculator 34 calculates the frequency information f of the three-phase AC power from the two-phase voltage signals $V_α'$ and $V_β'$. The frequency detector 30 detects the frequency information f of the three-phase AC power from the three-phase voltage signals $V_a$, $V_b$, and $V_c$.

Figure 9:
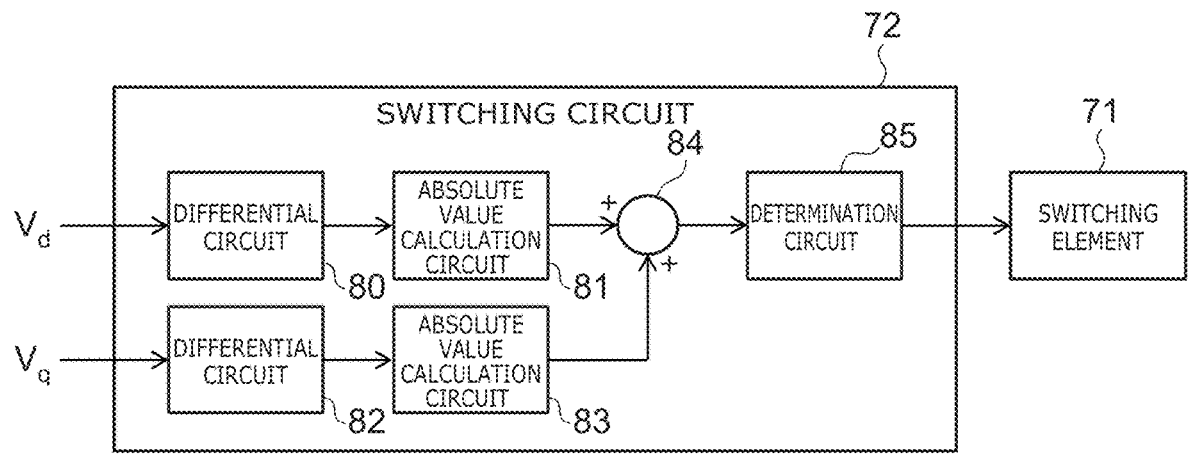
FIG. 9 is a block diagram schematically illustrating the switching circuit.

FIG. 9 is a block diagram schematically illustrating the switching circuit.

As illustrated in FIG. 9, the switching circuit 72 includes a differential circuit 80, an absolute value calculation circuit 81, a differential circuit 82, an absolute value calculation circuit 83, an adder 84, and a determination circuit 85. The voltage signals $V_d$ and $V_q$ that are calculated by the rotating coordinate converter 41 are input to the switching circuit 72.

The differential circuit 80 calculates the derivative of the voltage signal $V_d$. In other words, the differential circuit 80 calculates the slope of the voltage signal $V_d$. The absolute value calculation circuit 81 calculates the absolute value of the derivative of the voltage signal $V_d$ calculated by the differential circuit 80.

Similarly, the differential circuit 82 calculates the derivative of the voltage signal $V_q$. In other words, the differential circuit 82 calculates the slope of the voltage signal $V_q$. The absolute value calculation circuit 83 calculates the absolute value of the derivative of the voltage signal $V_q$ calculated by the differential circuit 82.

The adder 84 calculates the total value of the absolute value of the derivative of the voltage signal $V_d$ and the absolute value of the derivative of the voltage signal $V_q$ and inputs the calculated total value to the determination circuit 85.

The determination circuit 85 determines whether or not the input total value is not less than a prescribed value. The voltage signal $V_d$ of the d-axis component of the three-phase AC power and the voltage signal $V_q$ of the q-axis component abruptly change when a phase jump occurs in the three-phase AC power. Therefore, when the total value of the absolute value of the derivative of the voltage signal $V_d$ and the absolute value of the derivative of the voltage signal $V_q$ reaches or exceeds the prescribed value, it can be considered that a phase jump has occurred in the three-phase AC power.

The determination circuit 85 switches the path of the switching element 71. When the total value is less than the prescribed value, the determination circuit 85 sets the switching element 71 to the state in which the output of the rate limiter 66 is input to the arithmetic unit 65. In other words, the first state is selected when the determination circuit 85 determines that a phase jump has not occurred in the power system.

When the total value is not less than the prescribed value, the determination circuit 85 sets the switching element 71 to the state in which the output of the prediction calculator 70 is input to the arithmetic unit 65. In other words, the second state is selected when the determination circuit 85 determines that a phase jump has occurred in the three-phase AC power.

Thus, the switching circuit 72 selects the first state when the total value of the absolute value of the derivative of the voltage signal $V_d$ and the absolute value of the derivative of the voltage signal $V_q$ is less than the prescribed value, and selects the second state when the total value is not less than the prescribed value.

When switching from the first state to the second state, for example, the determination circuit 85 determines whether or not a constant interval has elapsed from the timing of switching from the first state to the second state, and returns the second state to the first state after the constant interval has elapsed.

In other words, the frequency calculator 34 calculates a system frequency f based on the angular frequency ω output from the rate limiter 66, and when determining that a phase jump has occurred in the power system, switches to the predicted value ω' output from the prediction calculator 70 for a constant interval, and calculates the system frequency f based on the predicted value ω' for the constant interval from the determination of the occurrence of the phase jump.

The frequency detector 30 may have the function of externally outputting the detection result of the occurrence of the phase jump. Thereby, for example, in the power measurement device 10b that includes the frequency detector 30, etc., it is possible to utilize the detection result of the occurrence of the phase jump; and the functionality of the frequency detector 30 can be further increased.

Figure 10:
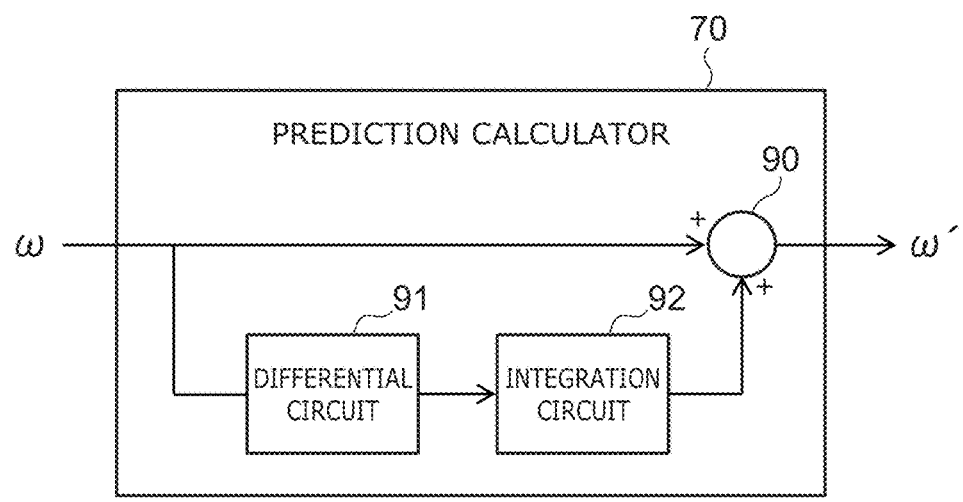
FIG. 10 is a block diagram schematically illustrating the prediction calculator.

FIG. 10 is a block diagram schematically illustrating the prediction calculator.

As illustrated in FIG. 10, the prediction calculator 70 includes an adder 90, a differential circuit 91, and an integration circuit 92.

The prediction calculator 70 inputs the angular frequency ω output from the rate limiter 66 to the adder 90 and inputs the angular frequency ω output from the rate limiter 66 to the differential circuit 91. More specifically, the prediction calculator 70 inputs, to the adder 90 and the differential circuit 91, an angular frequency ω(t0) at a timing t0 at which it is determined that a phase jump occurred in the three-phase AC power.

The differential circuit 91 calculates a derivative dω(t0)/dt of the input angular frequency ω(t0) differentiated over time. The integration circuit 92 calculates the prediction change amount (t−t0)×dω(t0)/dt of the angular frequency ω after a prescribed time interval t has elapsed from the timing t0 at which it is determined that the phase jump occurred by integrating the derivative dω(t0)/dt, and inputs the prediction change amount (t−t0)×dω(t0)/dt to the adder 90.

The adder 90 calculates the predicted value ω' of the angular frequency ω by adding the angular frequency ω(t0) at the timing t0 at which it is determined that the phase jump occurred and the prediction change amount (t−t0)×dω(t0)/dt. In other words, the prediction calculator 70 calculates the predicted value ω' using the following formula (1)

[Formula 1]

$$\omega'(t) = \omega(t0) + \frac{d\omega}{dt}(t0)(t - t0) \quad (1)$$

Thus, the prediction calculator 70 calculates the predicted value ω' of the angular frequency ω after a prescribed time interval has elapsed based on the angular frequency ω and the derivative of the angular frequency ω. For example, as illustrated in formula (1), the prediction calculator 70 fixes the angular frequency ω and the derivative used in the calculation of the predicted value ω' to be the angular frequency ω(t0) and the derivative dω(t0)/dt at the timing t0 at which it is determined that the phase jump occurred.

FIGS. 11A to 11G are graphs schematically illustrating examples of operations of the frequency detector.

In FIGS. 11A to 11G, the horizontal axis is time.

Figure 11A:
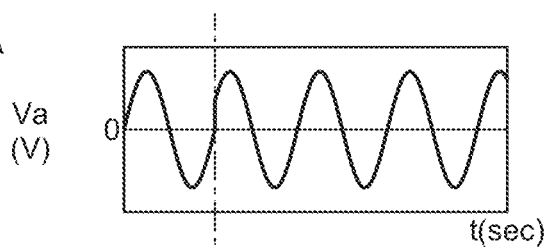
FIGS. 11A to 11G are graphs schematically illustrating examples of operations of the frequency detector.

The vertical axis of FIG. 11A is an example of the three-phase voltage signal $V_a$.

Figure 11B:
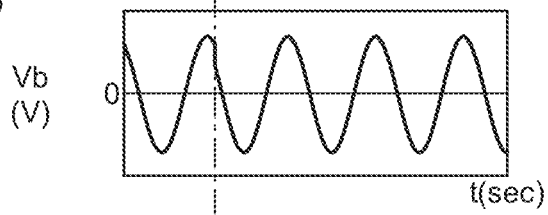

The vertical axis of FIG. 11B is an example of the three-phase voltage signal $V_b$.

Figure 11C:
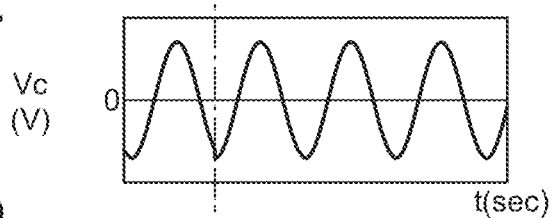

The vertical axis of FIG. 11C is an example of the three-phase voltage signal $V_c$.

Figure 11D:
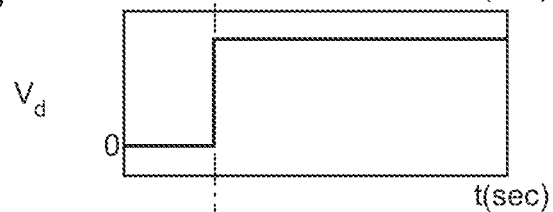

The vertical axis of FIG. 11D is an example of the voltage signal $V_d$ of the rotating coordinate system.

Figure 11E:
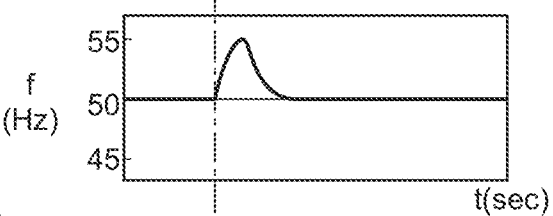

The vertical axis of FIG. 11E is an example of a reference system frequency f calculated by the arithmetic unit 65 as-is from the angular frequency ω calculated by the adder 60 without passing through the rate limiter 66, etc.

Figure 11F:
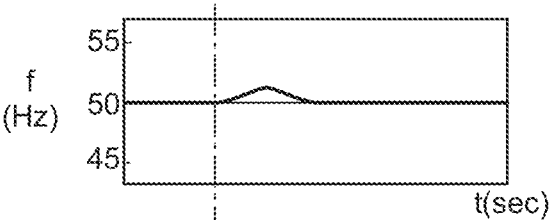

The vertical axis of FIG. 11F is an example of a reference frequency information f calculated by the configuration of the frequency detector 30 in which the angular frequency ω output from the rate limiter 66 is input to the arithmetic unit 65 without switching to the prediction calculator 70 even when the phase jump occurs.

Figure 11G:
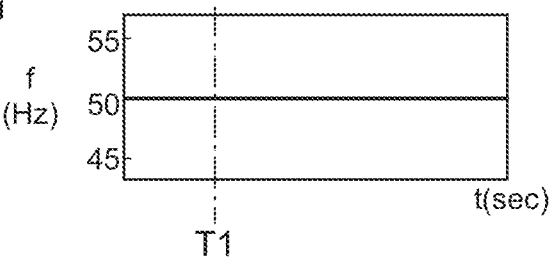

The vertical axis of FIG. 11G is an example of a frequency information f calculated by the configuration of the frequency detector 30.

FIGS. 11A to 11G illustrate examples when a phase jump of about 30 degrees occurs at a time T1. Also, in FIGS. 11A to 11G, the actual frequency of the three-phase AC power is set to 50 Hz.

As illustrated in FIG. 11D, the voltage signal $V_d$ of the d-axis component of the three-phase AC power abruptly changes when the phase jump occurs. Similarly, the voltage signal $V_q$ of the q-axis component also abruptly changes.

As illustrated in FIG. 11E, a mismeasurement of about 5 Hz occurs when the phase jump occurs when the frequency information f is calculated without using the rate limiter 66, etc.

Conversely, in a configuration in which the output-input difference of the rate limiter 66 is fed back to the calculation of the proportional-integral control as illustrated in FIG. 11F, the mismeasurement when the phase jump occurs can be suppressed to about 1 Hz.

Also, the mismeasurement when the phase jump occurs can be further suppressed in the frequency detector 30 that switches from the angular frequency ω of the rate limiter 66 to the predicted value ω' of the prediction calculator 70 when the occurrence of the phase jump is detected. In the frequency detector 30, the mismeasurement can be suppressed to about 0.01 Hz.

For example, when the actual frequency of the three-phase AC power is substantially constant as in the example illustrated in FIG. 11, the derivative dω(t0)/dt of the angular frequency ω(t0) at the timing t0 at which it is determined that the phase jump occurred is substantially 0. Accordingly, in such a case, ω'≈ω(t0), and the fluctuation of the frequency information f can be suppressed.

Figure 12A:
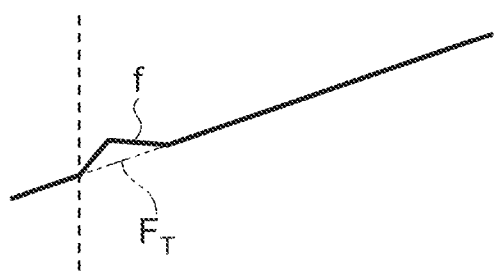
FIGS. 12A to 12C are graphs schematically illustrating examples of operations of the frequency detector.
Figure 12B:
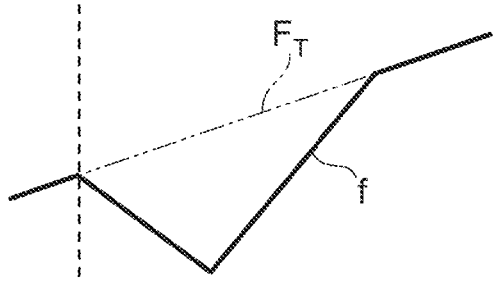
Figure 12C:
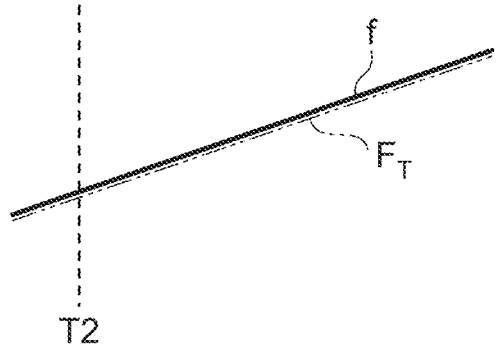

FIGS. 12A to 12C are graphs schematically illustrating examples of operations of the frequency detector.

In FIGS. 12A to 12C, the horizontal axis is time.

In FIGS. 12A and 12B, the vertical axis is an example of a reference frequency information f calculated by the configuration of the frequency detector 30 in which the angular frequency ω output from the rate limiter 66 is input to the arithmetic unit 65 without switching to the prediction calculator 70 even when the phase jump occurs.

The vertical axis of FIG. 12C is an example of the frequency information f calculated by the configuration of the frequency detector 30.

FIGS. 12A to 12C schematically illustrate an example of the frequency information f calculated for conditions such that an actual frequency $F_T$ of the three-phase AC power fluctuates at a smaller change rate than the rate limiter 66. Also, FIG. 12A illustrates an example when a phase jump occurs in the positive direction at a time T2. FIG. 12B illustrates an example when a phase jump occurs in a negative direction at the time T2.

As a result of diligent investigations, the inventor of the application discovered that when the actual frequency $F_T$ of the three-phase AC power fluctuates at a smaller change rate than the rate limiter 66 as illustrated in FIGS. 12A and 12B, and when the frequency information f is calculated using the angular frequency ω output from the rate limiter 66, a mismeasurement of the frequency information f occurs, and the frequency information f undesirably fluctuates according to the change rate of the rate limiter 66. Also, the inventor of the application discovered that the frequency information f fluctuates in the increasing direction when the phase jumps in the positive direction, and the frequency information f fluctuates in the decreasing direction when the phase jumps in the negative direction as illustrated in FIGS. 12A and 12B.

Conversely, when the frequency information f is calculated using the predicted value ω' of the prediction calculator 70, the fluctuation (the slope) of the actual frequency $F_T$ of the three-phase AC power can be predicted based on the derivative dω(t0)/dt of the angular frequency ω(t0) at the timing t0 at which it is determined that the phase jump occurred.

Accordingly, in the frequency detector 30, the mismeasurement of the frequency information f when the phase jump occurs can be suppressed even when the phase jump occurs in a state in which the actual frequency $F_T$ of the three-phase AC power fluctuates at a smaller change rate than the rate limiter 66 as illustrated in FIG. 12C.

As described above, the frequency detector 30 according to the embodiment calculates the frequency information f based on the angular frequency ω output from the rate limiter 66, and when it is determined that a phase jump has occurred in the three-phase AC power, switches to the predicted value ω' output from the prediction calculator 70 for a constant interval and calculates the frequency information f based on the predicted value ω' for the constant interval from the determination of the occurrence of the phase jump. Even when a phase jump or the like occurs in the three-phase AC power, an abrupt fluctuation of the frequency information f can be suppressed thereby, and the error of the calculation of the frequency information f can be reduced. Also, the calculation of the frequency information f is an open loop; therefore, effects on the speed of the voltage phase tracking by PLL can be suppressed even when the rate limiter 66 is included in the part calculating the frequency information f. Accordingly, the frequency detector 30 can be provided in which the change of the frequency information f can be quickly tracked, and an erroneous detection of the frequency information f can be suppressed even when a system disturbance occurs.

The constant interval of switching the prediction calculator 70 is, for example, not less than about 10 msec and not more than about 300 msec. If the constant interval is too short, for example, there is a risk that the calculation of the frequency information f may be undesirably returned to using the rate limiter 66 in a state in which the frequency information f calculated by the rate limiter 66 is fluctuating as illustrated in FIG. 12A, FIG. 12B, etc. It is therefore favorable for the constant interval to be not less than 10 msec. On the other hand, if the constant interval is too long, there is a risk that an erroneous detection of the frequency information f may undesirably occur when the slope of the change of the actual frequency $F_T$ of the three-phase AC power fluctuates. It is therefore favorable for the constant interval to be not more than 300 msec. It is more favorable for the constant interval to be, for example, not less than about 100 msec and not more than about 200 msec. The erroneous detection of the frequency information f can be more appropriately suppressed thereby.

Thus, the power measurement device 10b according to the embodiment further includes the frequency detector 30 and calculates the average value $P_{ave}$ of the active power and the average value $Q_{ave}$ of the reactive power corresponding to the frequency of the three-phase AC power based on the frequency information f detected by the frequency detector 30. Thereby, the average value $P_{ave}$ of the active power and the average value $Q_{ave}$ of the reactive power can be calculated based on a more accurate frequency information f even when a phase jump or the like occurs in the three-phase AC power; and the average apparent power can be more accurately measured.

Figure 13:
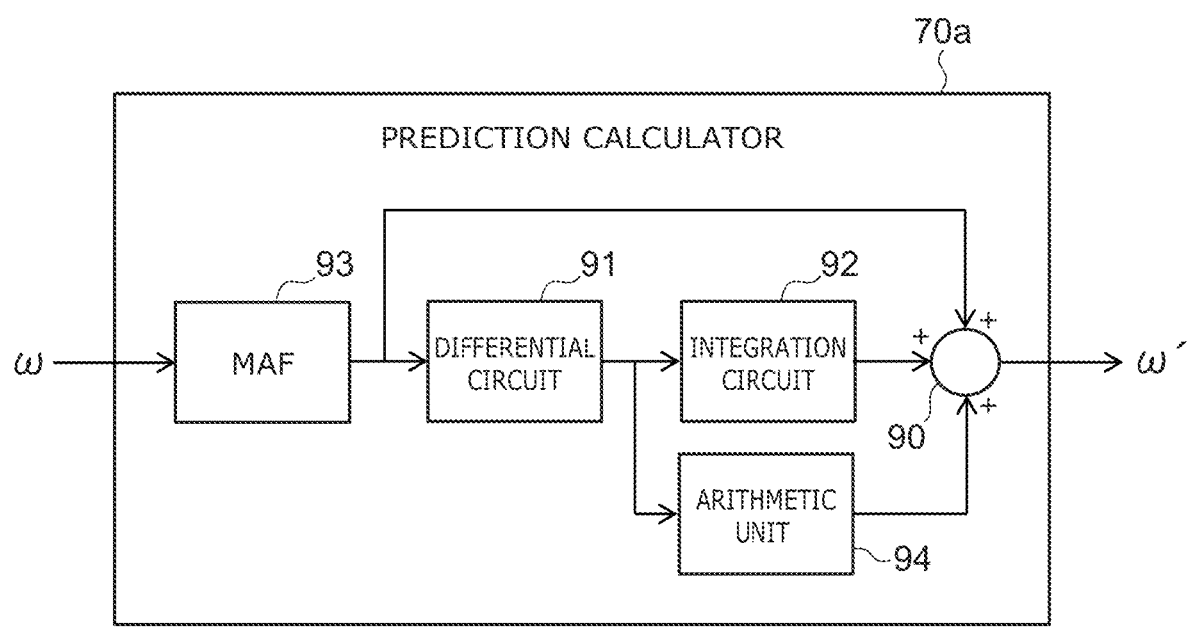
FIG. 13 is a block diagram schematically illustrating a modification of the prediction calculator.

FIG. 13 is a block diagram schematically illustrating a modification of the prediction calculator.

As illustrated in FIG. 13, the prediction calculator 70a further includes a moving average filter 93 and an arithmetic unit 94.

The moving average filter 93 calculates the moving average of the angular frequency ω output from the rate limiter 66 and inputs the angular frequency ω after the moving average calculation to the adder 90 and the differential circuit 91.

The differential circuit 91 calculates the derivative dω(t0)/dt based on the angular frequency ω(t0) after the moving average calculation input from the moving average filter 93 and inputs the derivative dω(t0)/dt to the integration circuit 92 and the arithmetic unit 94.

Similarly to the description above, the integration circuit 92 calculates the prediction change amount (t−t0)×dω(t0)/dt of the angular frequency ω by integrating the derivative dω(t0)/dt, and inputs the prediction change amount (t−t0)× dω(t0)/dt to the adder 90.

The arithmetic unit 94 calculates the correction value of the prediction change amount calculated by the integration circuit 92 by multiplying the derivative dω(t0)/dt input from the differential circuit 91 by a prescribed coefficient delaycomp. The arithmetic unit 94 inputs the calculated correction value to the adder 90.

The adder 90 calculates the predicted value ω' of the angular frequency ω by adding the angular frequency ω(t0) at the timing t0 at which it is determined that the phase jump occurred, the prediction change amount (t−t0)×dω(t0)/dt, and the correction value. In other words, the prediction calculator 70a calculates the predicted value ω' using the following formula (2).

[Formula 2]

$$\omega'(t) = \omega(t0) + \frac{d\omega}{dt}(t0)(t-t0) + \frac{d\omega}{dt}(t0) \times delaycomp \quad (2)$$

Thus, the prediction calculator 70a calculates the predicted value ω' based on the angular frequency ω(t0), the prediction change amount (t−t0)×dω(t0)/dt, and the correction value.

There is a possibility that noise such as power supply noise, measurement noise, or the like may be superimposed onto the angular frequency ω output from the rate limiter 66. If noise is superimposed onto the angular frequency ω(t0) when the derivative dω(t0)/dt is calculated by the differential circuit 91, there is a possibility that a slope that corresponds to the noise may be erroneously calculated, and erroneous detection of the frequency information f may undesirably occur.

Therefore, the prediction calculator 70a further includes the moving average filter 93 and calculates the moving average of the angular frequency ω. Thereby, the effects of noise superimposed onto the angular frequency ω can be suppressed.

On the other hand, when the moving average filter 93 is included, there is a possibility that a lag may undesirably occur in the predicted value of the frequency information f based on the predicted value ω' due to a phase lag due to the moving average filter 93. For example, when a phase jump occurs in a state in which the actual frequency Fr of the three-phase AC power is fluctuating, there is a possibility that a lag may undesirably occur in the predicted value of the frequency information f.

Therefore, the prediction calculator 70a further includes the arithmetic unit 94, calculates a correction value of the prediction change amount, and calculates the predicted value ω' based on the angular frequency ω(t0), the prediction change amount (t−t0)×dω(t0)/dt, and the correction value.

The arithmetic unit 94 calculates the correction value to suppress the phase lag due to the moving average filter 93. For example, the coefficient delaycomp of the arithmetic unit 94 is set according to a window length $T_\omega$ of the moving average filter 93. For example, the coefficient delaycomp is set to a value that is about half (about 0.4 times to 0.6 times) of the window length $T_\omega$. For example, when the window length $T_\omega$ of the moving average filter 93 is 40 msec, the coefficient delaycomp is set to the value of 20 msec (0.02). The phase lag due to the moving average filter 93 can be suppressed thereby.

The window length $T_\omega$ of the moving average filter 93 is, for example, not less than 10 msec and not more than 100 msec. By setting the window length $T_\omega$ of the moving average filter 93 to be not less than 10 msec, the noise that is superimposed onto the angular frequency ω can be appropriately suppressed. By setting the window length $T_\omega$ of the moving average filter 93 to be not more than 100 msec, an excessively long phase lag due to the moving average filter 93 can be suppressed.

Thus, the prediction calculator 70a uses the moving average filter 93 to suppress the effects of the noise superimposed onto the angular frequency ω, and uses the arithmetic unit 94 to suppress the phase lag due to the moving average filter 93. Thereby, even when noise is superimposed onto the angular frequency ω, the effects of the noise can be suppressed and the erroneous detection of the frequency information f can be more appropriately suppressed. The frequency information f can be more accurately detected.

For example, the moving average filter 93 and the arithmetic unit 94 may be omitted when the noise that is superimposed onto the angular frequency ω can be appropriately suppressed by the moving average filters 42, 43, etc., included in the orthogonal coordinate signal generator 32, etc. In other words, the frequency information f can be predicted by the configuration of the prediction calculator 70 illustrated in FIG. 10.

Figure 14:
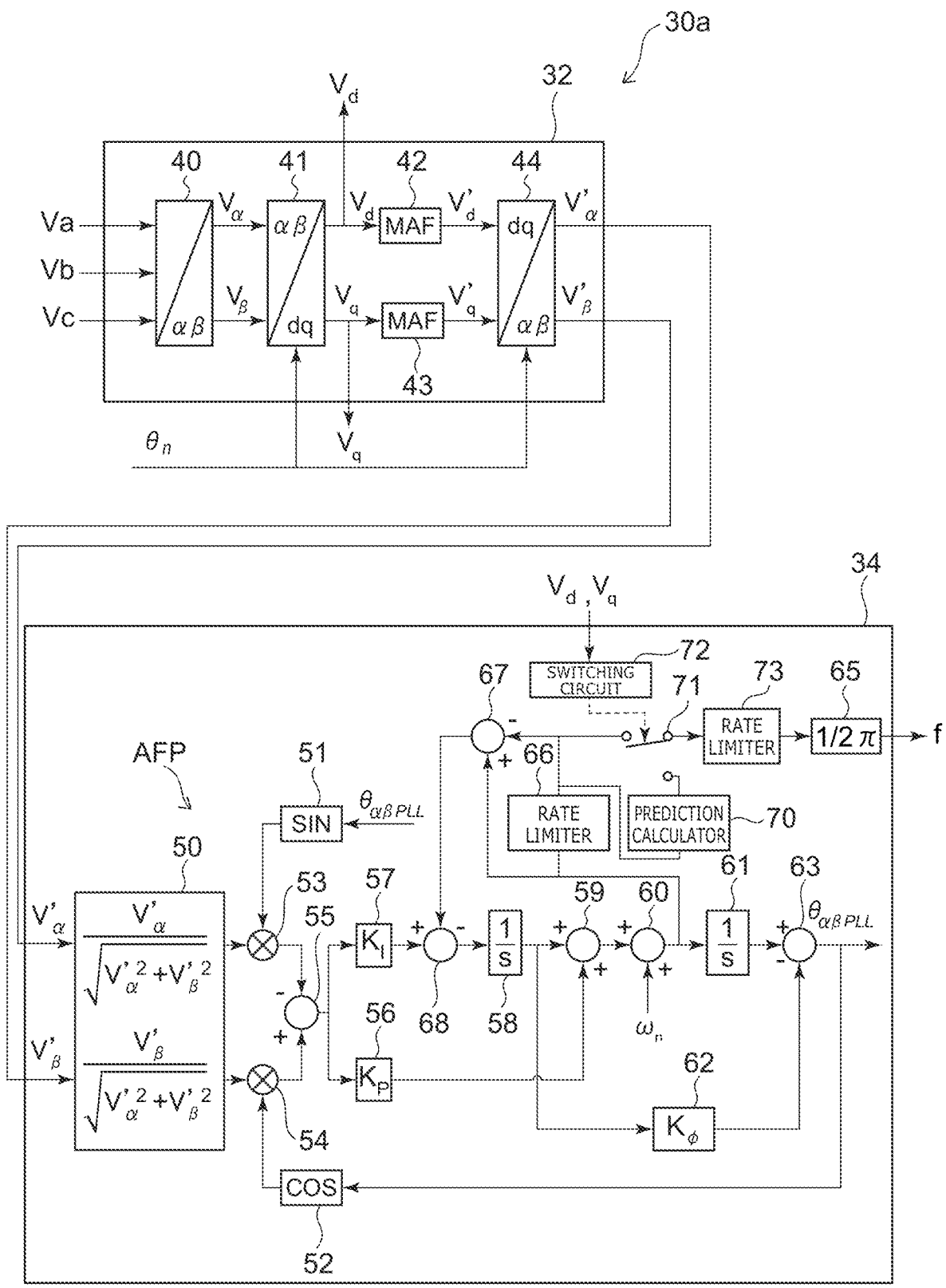
FIG. 14 is a block diagram schematically illustrating a modification of the frequency detector.

FIG. 14 is a block diagram schematically illustrating a modification of the frequency detector.

In the frequency detector 30a as illustrated in FIG. 14, the frequency calculator 34 further includes a rate limiter 73 (a limiting part).

The rate limiter 73 is located between the arithmetic unit 65 and the rate limiter 66 and between the arithmetic unit 65 and the prediction calculator 70. In other words, the rate limiter 73 is located between the arithmetic unit 65 and the switching element 71. Thereby, one of the angular frequency ω output from the rate limiter 66 or the predicted value ω' output from the prediction calculator 70 is selectively input to the rate limiter 73.

The rate limiter 73 limits the change of the frequency information f equal to or greater than the prescribed change rate by limiting the change of the angular frequency ω or the predicted value ω' equal to or greater than the prescribed change rate. For example, the rate limiter 73 suppresses the change of the frequency information f equal to or greater than 4 Hz/sec.

Thus, by including the rate limiter 73, an abrupt change of the frequency information f when the switching circuit 72 switches between the first state and the second state can be suppressed. In other words, the undesirable abrupt change of the frequency information f at the timing of switching from the angular frequency ω to the predicted value ω' or at the timing of switching from the predicted value ω' to the angular frequency ω can be suppressed.

Figure 15:
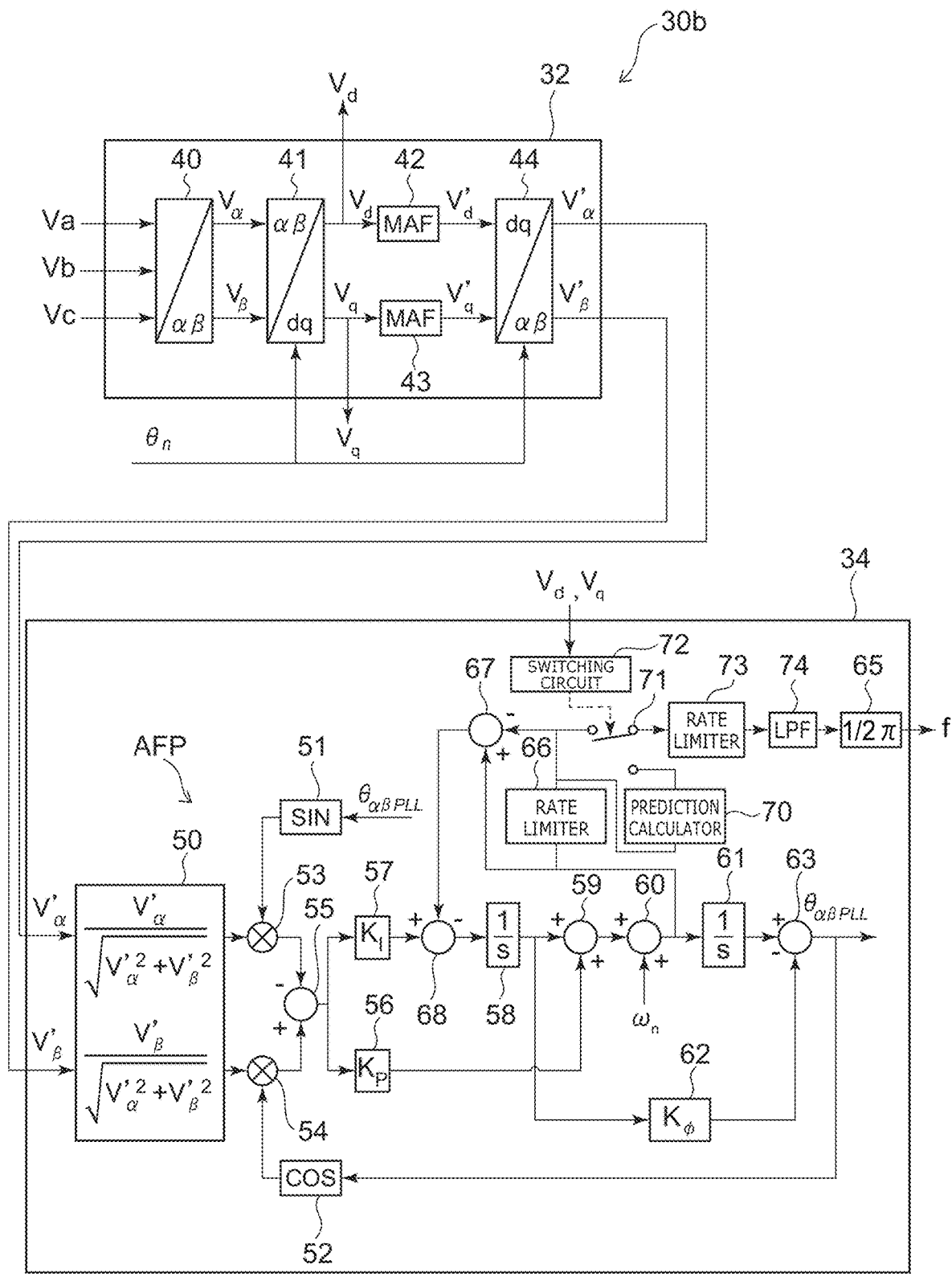
FIG. 15 is a block diagram schematically illustrating a modification of the frequency detector.

FIG. 15 is a block diagram schematically illustrating a modification of the frequency detector.

In the frequency detector 30b as illustrated in FIG. 15, the frequency calculator 34 further includes a low-pass filter 74. The low-pass filter 74 is arranged in series with the arithmetic unit 65. For example, the low-pass filter 74 is located between the arithmetic unit 65 and the rate limiter 73.

The low-pass filter 74 suppresses the high frequency components of the angular frequency ω or the predicted value ω'. The low-pass filter 74 attenuates higher frequency components than a prescribed frequency of the angular frequency ω or the predicted value ω'. In other words, the low-pass filter 74 suppresses an abrupt fluctuation of the angular frequency ω or the predicted value ω'. The low-pass filter 74 may include, for example, a moving average filter. The low-pass filter 74 inputs the angular frequency ω or the predicted value ω' after the high frequency components are suppressed to the arithmetic unit 65.

The low-pass filter 74 is arranged in series with the arithmetic unit 65. The low-pass filter 74 suppresses the high frequency component of the frequency information f by suppressing the high frequency components of the angular frequency ω or the predicted value ω'. The low-pass filter 74 suppresses an abrupt fluctuation of the frequency information f.

Thus, by providing the low-pass filter 74, even when a phase jump or the like occurs in the three-phase AC power, an abrupt fluctuation of the frequency information f can be suppressed, and the error of the calculation of the frequency information f can be further reduced.

The low-pass filter 74 is not limited to being located between the arithmetic unit 65 and the rate limiter 73, and may be located before the rate limiter 73 or may be located after the arithmetic unit 65. The configuration of the low-pass filter 74 may be any configuration that can be arranged in series with the arithmetic unit 65 and can suppress the high frequency components of the frequency information f.

According to embodiments described above, the configuration of an αβEPMAFPLL is schematically illustrated as the angular frequency calculator AFP of the frequency calculator 34. The configuration of the angular frequency calculator AFP is not limited thereto. The configuration of the angular frequency calculator AFP may be, for example, an EPMAFPLL (Enhanced Pre-filtering Moving Average Filter PLL) configuration, a PMAFPLL (Pre-filtering Moving Average Filter PLL) configuration, an EPMAFPLL Type 2 configuration, etc.

Hereinabove, exemplary embodiments of the invention are described with reference to specific examples. However, embodiments of the invention are not limited to these specific examples. For example, one skilled in the art may similarly practice the invention by appropriately selecting specific configurations of components included in the power measurement devices 10, 10a, and 10b from known art; and such practice is within the scope of the invention to the extent that similar effects can be obtained.

Furthermore, any two or more components of the specific examples may be combined within the extent of technical feasibility, and are within the scope of the invention to the extent that the purport of the invention is included.

Moreover, all power measurement devices practicable by an appropriate design modification by one skilled in the art based on the power measurement devices 10, 10a, and 10b described above as exemplary embodiments of the invention also are within the scope of the invention to the extent that the purport of the invention is included.

Furthermore, various modifications and alterations within the spirit of the invention will be readily apparent to those skilled in the art; and all such modifications and alterations should be seen as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A power measurement device, comprising:
   a first three-phase to two-phase converter converting a three-phase voltage signal of three-phase alternating current power into a two-phase voltage signal;
   a second three-phase to two-phase converter converting a three-phase current signal of the three-phase alternating current power into a two-phase current signal;
   an instantaneous power calculator calculating an instantaneous value of active power of the three-phase alternating current power and an instantaneous value of reactive power of the three-phase alternating current power based on the two-phase voltage signal and the two-phase current signal;

a first moving average calculator including a plurality of first moving average filters calculating moving averages, the plurality of first moving average filters using different data quantities, the first moving average calculator causing the plurality of first moving average filters to respectively calculate a plurality of active power average values of different moving average data quantities;

a second moving average calculator including a plurality of second moving average filters calculating moving averages, the plurality of second moving average filters using different data quantities, the second moving average calculator causing the plurality of second moving average filters to respectively calculate a plurality of reactive power average values of different moving average data quantities;

a first average value calculator calculating an average value of the active power corresponding to a frequency of the three-phase alternating current power based on the plurality of active power average values and frequency information representing the frequency of the three-phase alternating current power; and a second average value calculator calculating an average value of the reactive power corresponding to the frequency of the three-phase alternating current power based on the plurality of reactive power average values and the frequency information representing the frequency of the three-phase alternating current power.

2. The power measurement device according to claim 1, wherein the first average value calculator calculates the average value of the active power corresponding to the frequency of the three-phase alternating current power by selecting a prescribed number of active power average values among the plurality of active power average values at frequencies near the frequency represented by the frequency information, and by performing linear interpolation of the selected prescribed number of active power average values, and the second average value calculator calculates the average value of the reactive power corresponding to the frequency of the three-phase alternating current power by selecting a prescribed number of reactive power average values among the plurality of reactive power average values at frequencies near the frequency represented by the frequency information, and by performing linear interpolation of the selected prescribed number of reactive power average values.

3. The power measurement device according to claim 1, further comprising:

a first median filter calculating a median value of a prescribed number of active power average values calculated by the first average value calculator; and a second median filter calculating a median value of a prescribed number of reactive power average values calculated by the second average value calculator.

4. The power measurement device according to claim 1, further comprising:

a frequency detector detecting the frequency of the three-phase alternating current power and inputting the frequency information of the detected frequency to the first and second average value calculators.

5. The power measurement device according to claim 4, wherein the frequency detector includes:

an orthogonal coordinate signal generator generating an orthogonal two-phase voltage signal from the three-phase voltage signal of the three-phase alternating current power by converting the three-phase voltage signal into an orthogonal two-phase voltage signal, converting the orthogonal two-phase voltage signal into a voltage signal of a rotating coordinate system, calculating a moving average of the voltage signal of the rotating coordinate system, and performing an inverse transformation of the voltage signal of the rotating coordinate system after calculating the moving average; and a frequency calculator including an angular frequency calculator calculating an angular frequency of the power system based on the two-phase voltage signal after calculating the moving average generated by the orthogonal coordinate signal generator, and an arithmetic unit calculating a system frequency of the power system from the angular frequency by multiplying the angular frequency by $1/2\pi$, the angular frequency calculator calculates the angular frequency by performing proportional-integral control based on the two-phase voltage signal, the frequency calculator further includes:

a rate limiter limiting a change of the system frequency equal to or greater than a prescribed change rate, the rate limiter feeding back an output-input difference of the rate limiter to the calculation of the proportional-integral control of the angular frequency calculator;

a prediction calculator calculating a predicted value of the angular frequency after a prescribed time interval has elapsed based on the angular frequency output from the rate limiter and a derivative of the angular frequency; and a switching circuit selectively switching between a first state of inputting the angular frequency output from the rate limiter to the arithmetic unit, and a second state of inputting the predicted value output from the prediction calculator to the arithmetic unit, and the switching circuit detects a phase jump of the power system based on the voltage signal of the rotating coordinate system calculated by the orthogonal coordinate signal generator, selects the first state in a state in which the phase jump of the power system is not detected, selects the second state for a constant interval when the phase jump of the power system is detected, and returns the second state to the first state after the constant interval has elapsed.

6. The power measurement device according to claim 5, wherein the prediction calculator calculates a moving average of the angular frequency output from the rate limiter, calculates a derivative of the angular frequency after the moving average, calculates a correction value by multiplying the derivative by a prescribed coefficient, and calculates the predicted value based on the correction value, the derivative, and the angular frequency after the moving average.

7. The power measurement device according to claim 5, wherein the frequency calculator further includes a limiting part limiting the change of the system frequency equal to or greater than the prescribed change rate by selectively receiving input of one of the angular frequency output from the rate limiter or the predicted value output from the prediction calculator and by limiting a change of the angular frequency or the predicted value equal to or greater than a prescribed change rate.

8. The power measurement device according to claim 5, wherein the frequency calculator further includes a low-pass filter arranged in series with the arithmetic unit, and the low-pass filter suppresses a high frequency component of the system frequency.

\* \* \* \* \*